(12) United States Patent
Tsai et al.

(10) Patent No.: US 11,398,567 B2
(45) Date of Patent: Jul. 26, 2022

(54) SEMICONDUCTOR DEVICE WITH NEGATIVE CAPACITANCE COMPRISING FERROELECTRIC LAYER INCLUDING AMORPHOUS AND CRYSTALS

(71) Applicant: TAIWAN SEMICONDUCTOR MANUFACTURING CO., LTD., Hsinchu (TW)

(72) Inventors: Wilman Tsai, Saratoga, CA (US); Ling-Yen Yeh, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/585,932

(22) Filed: Sep. 27, 2019

(65) Prior Publication Data
US 2020/0044091 A1   Feb. 6, 2020

Related U.S. Application Data

(62) Division of application No. 15/908,139, filed on Feb. 28, 2018, now Pat. No. 11,107,919.

(Continued)

(51) Int. Cl.
*H01L 29/78*   (2006.01)
*H01L 29/51*   (2006.01)
(Continued)

(52) U.S. Cl.
CPC .. *H01L 29/78391* (2014.09); *H01L 21/28194* (2013.01); *H01L 21/823431* (2013.01);
(Continued)

(58) Field of Classification Search
CPC ............... H01L 27/11551–11556; H01L 27/11578–11582; H01L 27/11526–11548; H01L 27/11573–11575; H01L 27/11524; H01L 27/11529; H01L 27/1157; H01L 29/66833;
(Continued)

(56) References Cited

U.S. PATENT DOCUMENTS 6,239,457 B1    5/2001  Suenaga et al.
8,088,644 B2    1/2012  Jin et al.
(Continued)

FOREIGN PATENT DOCUMENTS

CN    106711224 A    5/2017
KR    100932477 B1   12/2009
TW    201517236 A    5/2015

OTHER PUBLICATIONS

Final Office Action issued in related U.S. Appl. No. 15/908,139, dated Jun. 5, 2020.
(Continued)

*Primary Examiner* — Nelson Garces
(74) *Attorney, Agent, or Firm* — McDermott Will & Emery LLP

(57) ABSTRACT

In a method of manufacturing a negative capacitance structure, a ferroelectric dielectric layer is formed over a first conductive layer disposed over a substrate, and a second conductive layer is formed over the ferroelectric dielectric layer. The ferroelectric dielectric layer includes an amorphous layer and crystals.

20 Claims, 43 Drawing Sheets

Related U.S. Application Data

(60) Provisional application No. 62/552,900, filed on Aug. 31, 2017.

(51) Int. Cl.
  *H01L 21/28* (2006.01)
  *H01L 21/8234* (2006.01)
  *H01L 27/088* (2006.01)
  *H01L 29/66* (2006.01)

(52) U.S. Cl.
  CPC .... *H01L 27/0886* (2013.01); *H01L 29/40111* (2019.08); *H01L 29/516* (2013.01); *H01L 29/6684* (2013.01); *H01L 29/66545* (2013.01); *H01L 29/78* (2013.01)

(58) Field of Classification Search
  CPC ........... H01L 29/4234; H01L 21/02532; H01L 29/1037; H01L 21/26513; H01L 21/02595; H01L 21/02636; H01L 21/28282; H01L 21/31116; H01L 29/41741; H01L 27/11565; H01L 21/02164; H01L 29/518; H01L 29/513; H01L 21/0217; H01L 29/42344; H01L 29/792–7926; H01L 29/516; H01L 21/28291; H01L 29/6684; H01L 29/78391; H01L 21/823431; H01L 27/0886; H01L 29/40111; G11C 16/32; G11C 16/0483; G11C 16/10; G11C 16/0466; G11C 11/223
  See application file for complete search history.

(56) References Cited

U.S. PATENT DOCUMENTS

| | | | |
|---|---|---|---|
| 9,318,315 B2 | 4/2016 | Mueller et al. | |
| 9,722,093 B1 | 8/2017 | Xing et al. | |
| 9,871,112 B1* | 1/2018 | Cheng | H01L 29/7787 |
| 9,978,868 B2 | 5/2018 | Lai et al. | |
| 2007/0107774 A1* | 5/2007 | Jin | H01L 45/04 136/258 |
| 2007/0158765 A1 | 7/2007 | Ahn et al. | |
| 2011/0079883 A1 | 4/2011 | Shimada et al. | |
| 2014/0355328 A1 | 12/2014 | Muller et al. | |
| 2015/0076437 A1* | 3/2015 | Tao | H01L 45/1253 257/4 |
| 2015/0357429 A1 | 12/2015 | Dubourdieu et al. | |
| 2016/0005961 A1* | 1/2016 | Ino | H01L 45/06 257/4 |
| 2016/0141366 A1 | 5/2016 | Lai et al. | |
| 2016/0308070 A1 | 10/2016 | Chang et al. | |
| 2016/0336312 A1 | 11/2016 | Yan et al. | |
| 2017/0103988 A1* | 4/2017 | Nishida | H01L 29/517 |
| 2017/0141235 A1* | 5/2017 | Lai | H01L 29/401 |
| 2017/0162250 A1 | 6/2017 | Slesazeck et al. | |
| 2018/0006129 A1* | 1/2018 | Xing | H01L 29/42376 |
| 2018/0327913 A1* | 11/2018 | Lansalot-Matras | C23F 1/12 |
| 2019/0019875 A1* | 1/2019 | Tsai | H01L 29/66545 |

OTHER PUBLICATIONS

Non-Final Office Action issued in related U.S. Appl. No. 15/908,139, dated Feb. 13, 2020.
Academic Press Dictionary of Science and Technology, Edited by Christopher Morris, p. 818, 1992 (Year: 1992).
Final Office Action issued in related U.S. Appl. No. 15/908,139, dated Aug. 19, 2019.
Non-Final Office Action issued in related U.S. Appl. No. 15/908,139, dated Mar. 25, 2019.
Sharath, S. U., et al., "Towards Forming-Free Resistive Switching in oxygen Engineered Hfo2-x", Appl. Phys. Lett. 104, 063502 (2014).
Sharath, S. U., et al., "Thickness Independent Reduced Forming Voltage in Oxygen Engineered HfO2 Based Resistive Switching Memories", Appl. Phys. Lett. 105, 073505 (2014).
Boscke, T.S., et al., "Ferroelectricity in Hafnium Oxide: CMOS Compatible Ferroelectric Field Effect Transistors", 2011 IEEE, IEDM11-547-550.
Ushakov, S., et al., "Crystallization in Hafnia—and Zirconia—Based Systems", Physia Status Solidi(b), Aug. 2004.
Yang E., et al., "Columnar Grain Growth of FePt(L10) Thin Films", Journal of Applied Physics 11, 07B720 (2012).
Zavaliche, F., et al., "Electric Field-Induced Magnetization Switching in Epitaxial Columnar Nanostructures", American Chemical Society, 2005, vol. 5, No. 9, pp. 1793-1796.
Kim, K.D., et al., "Ferroelectricity in Undoped—HfO2 Thin Films Induced by Deposition Temperature Control During Atomic Layer Deposition", Journal of Materials Chemistry C, 2016, 4, pp. 6864-6872.
Hoffmann, M., et al., "Stabilizing the Ferroelectric Phase in Doped Hafnium Oxide", Journal of Applied Physics 118, 072006 (2015).
Polakowski, P., et al., "Ferroelectricity in Undoped Hafnium Oxide", Appl. Phys. Lett. 106, 232905 (2015).
Lomenzo, P. D., et al., "Ferroelectric Si-Doped HfO2 Device Properties on Highly Doped Germanium", IEEE Electron Device Letters, vol. 36, No. 8, Aug. 2015.
Li, Hong, et al., "Optoelectronic Crystal of Artificial Atoms in Strain-Textured Molybdenum Disulphide", Nature Communications, 2015, pp. 1-6.
Non-Final Office Action issued in U.S. Appl. No. 15/908,139, dated Dec. 31, 2020.

* cited by examiner

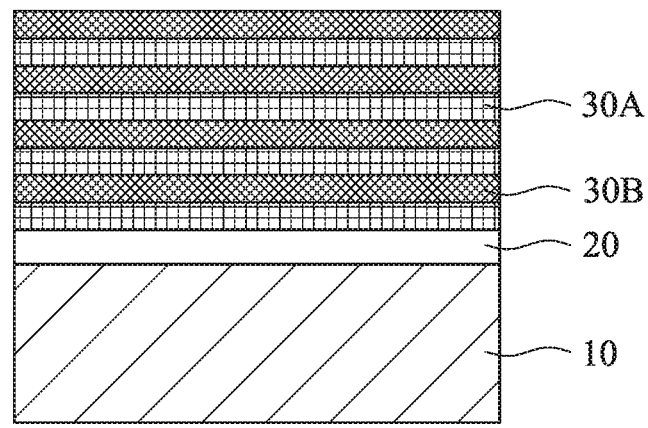
FIG. 5A
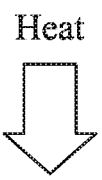
Heat
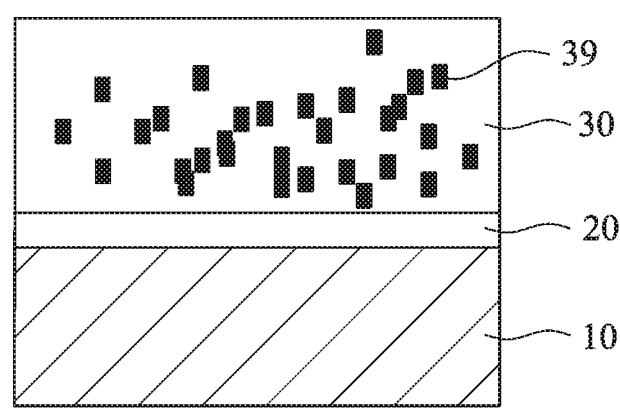
FIG. 5B

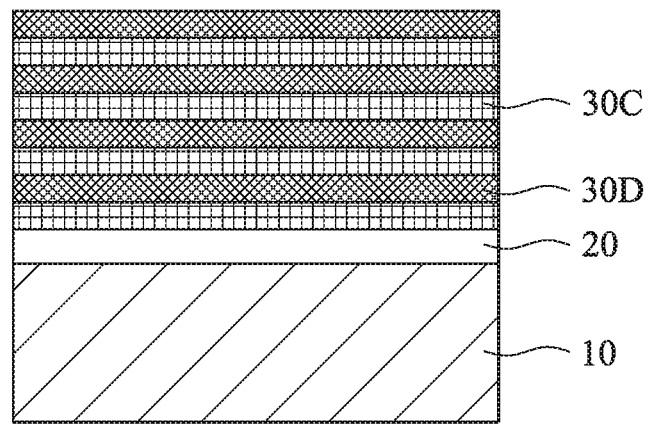
FIG. 5C
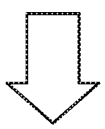
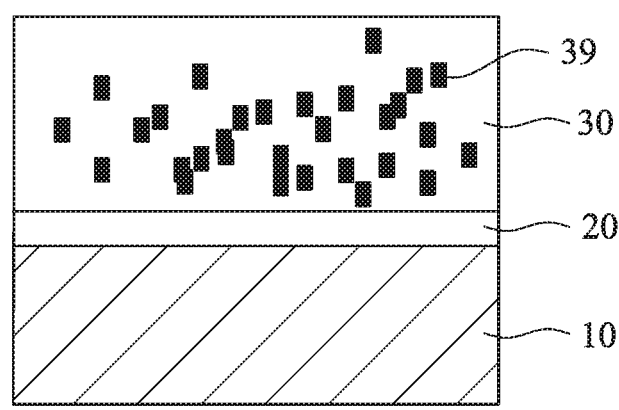
FIG. 5D

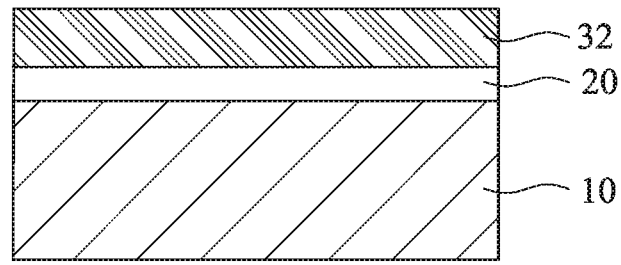
FIG. 7A
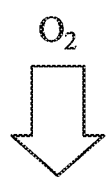
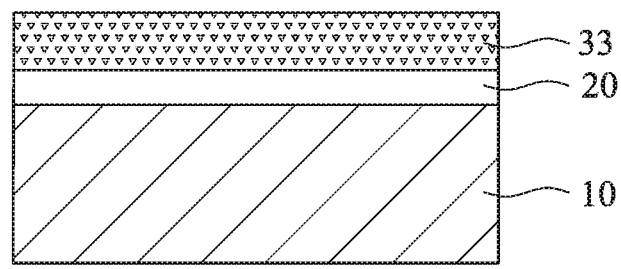
FIG. 7B

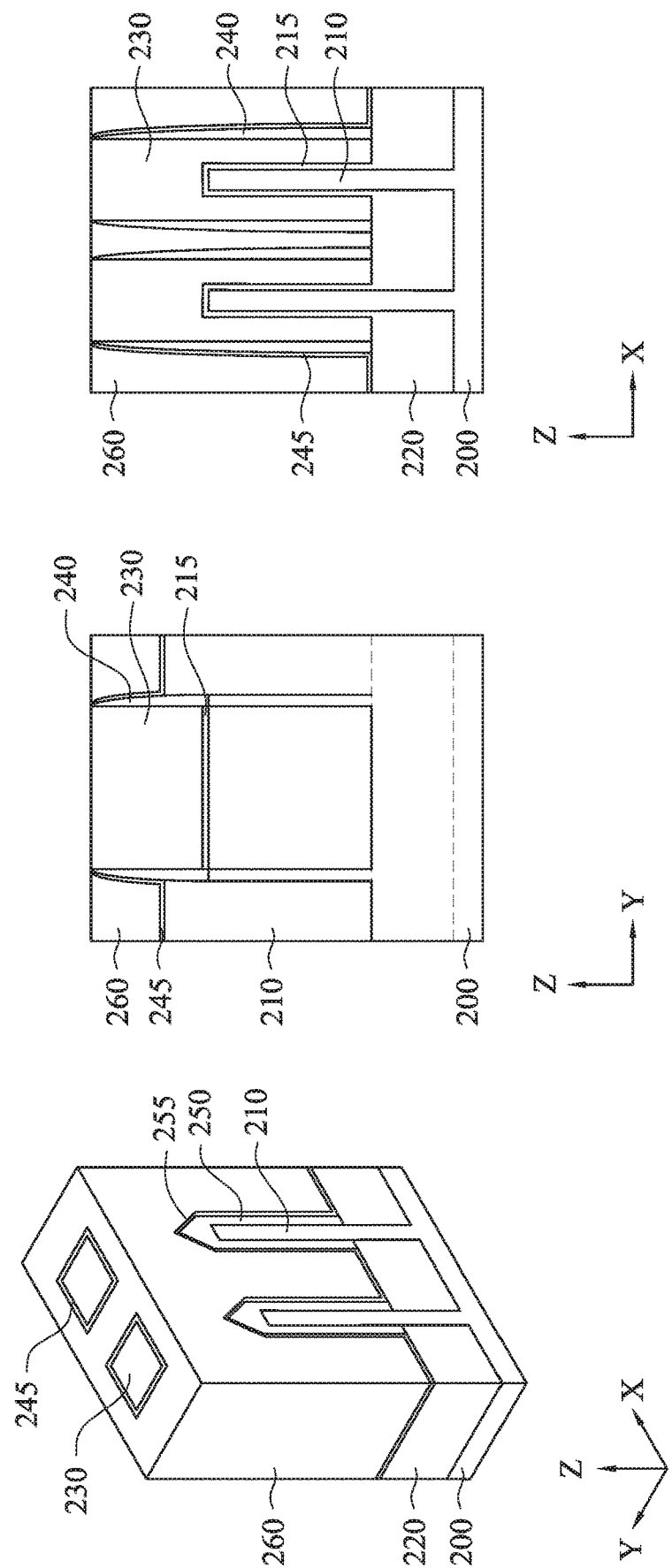

SEMICONDUCTOR DEVICE WITH NEGATIVE CAPACITANCE COMPRISING FERROELECTRIC LAYER INCLUDING AMORPHOUS AND CRYSTALS

RELATED APPLICATIONS

This application is a divisional of application Ser. No. 15/908,139 filed on Feb. 28, 2018, which claims priority of U.S. Provisional Patent Application No. 62/552,900 filed on Aug. 31, 2017, the entire contents of each of which are incorporated herein by reference.

TECHNICAL FIELD

The disclosure relates to semiconductor integrated circuits, and more particularly to semiconductor devices including negative capacitance field effect transistors (NCFETs).

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this metal-oxide-semiconductor (MOS) FET operating region. To improve the subthreshold properties, a negative capacitance field effect transistor (NCFET) using a ferroelectric material has been proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B show various stages of manufacturing operations for a negative capacitance structure in accordance with an embodiment of the present disclosure.

FIGS. 5C and 5D show various stages of manufacturing operations for a negative capacitance structure in accordance with an embodiment of the present disclosure.

FIGS. 7A, 7B, 7C and 7D show various stages of manufacturing operations for a negative capacitance structure in accordance with an embodiment of the present disclosure.

FIGS. 16A, 16B and 16C show one of various stages of manufacturing operations for an NCFET in accordance with an embodiment of the present disclosure.

DETAILED DESCRIPTION

Figure 1A:
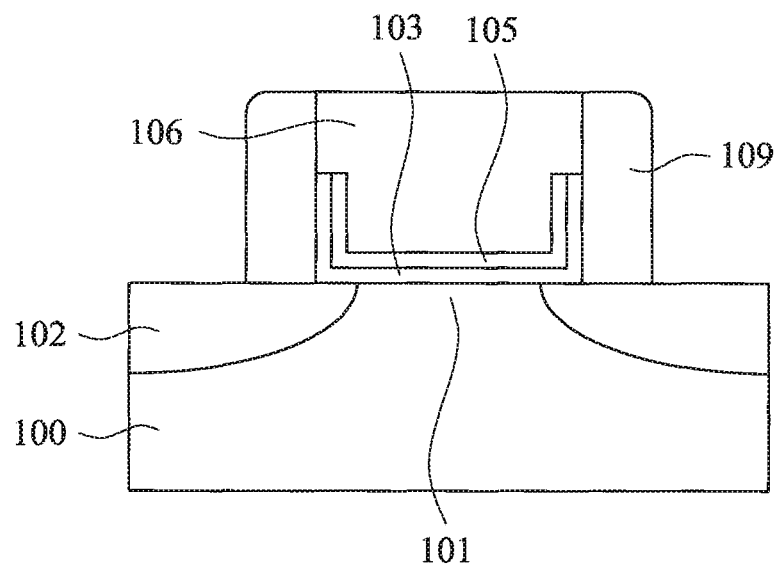
FIGS. 1A and 1B shows cross sectional views of metal-insulator-semiconductor (MIS) FET-type NCFETs.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

To lower subthreshold swing (S.S.) of a field effect transistor (FET), a negative-capacitance (NC) technology, such as integrating ferroelectric (FE) materials, provides a feasible solution to lower $V_{DD}$ (power supply) significantly, and achieves an FET having a steep S.S. for low power operation.

In an NCFET, a capacitor (e.g., a ferroelectric (FE) capacitor) having a negative capacitance is connected to a gate of a MOSFET in series. The ferroelectric negative capacitor can be a separate capacitor connected by a conductive layer (e.g., wire/contact) to the gate of the MOSFET, in some embodiments. In other embodiments, one of the electrodes of the negative capacitor is a gate electrode of the MOSFET.

In conventional devices, high-k gate dielectric materials, such as $HfO_2$, are usually an amorphous layer. However, un-doped $HfO_2$ is amorphous and paraelectric, which does not show a negative-capacitance effect. In the present disclosure, a ferroelectric layer including grains of stabilized crystalline phase and its production methods are provided. The proper combinations of strain (stress) and composition can maintain a stabilized ferroelectric phase (e.g., metastable orthorhombic phase of $HfO_2$). The stabilized crystalline phase includes, for example, nanocrystals and/or columnar-shaped crystals.

Figure 1B:
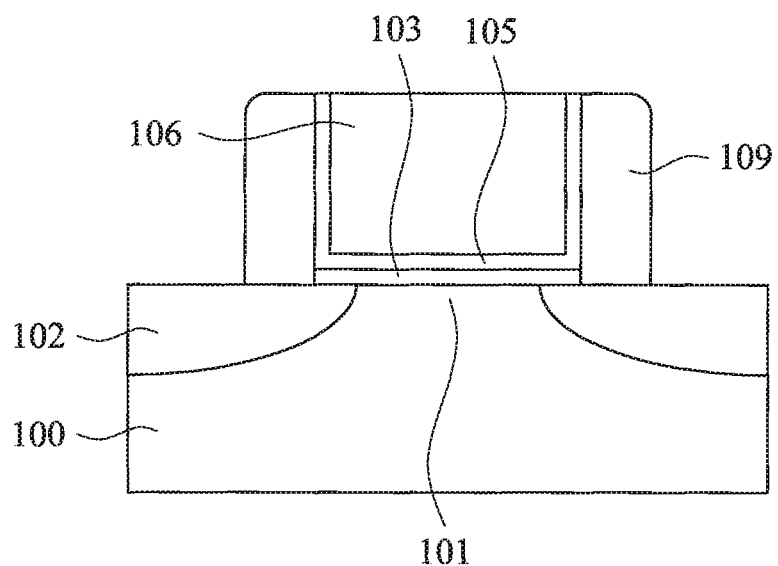
Figure 1C:
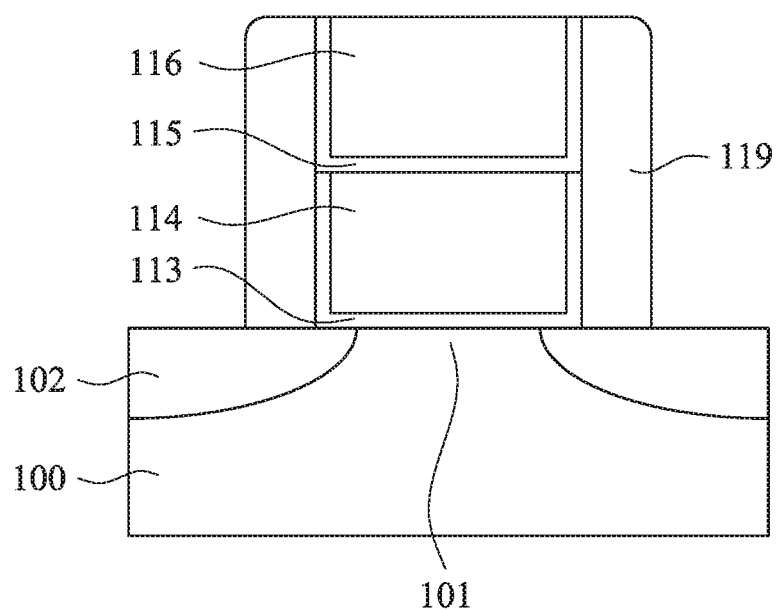
FIG. 1C shows a cross sectional view of a metal-insulator-metal-insulator-semiconductor (MIMIS) FET-type NCFET.

FIGS. 1A-1C shows cross sectional views of various NCFETs. FIGS. 1A and 1B show cross sectional views of metal-insulator-semiconductor (MIS) FET-type NCFETs, and FIG. 1C shows a cross sectional view of a metal-insulator-metal-insulator-semiconductor (MIMIS) FET-type NCFET. Although FIGS. 1A-1C show NCFETs of a planar MOS transistor structure, fin FETs and/or gate-all-around FETs can be employed.

As shown in FIG. 1A, an MIS NCFET includes a substrate 100, a channel 101 and source and drain 102. The source and drain 102 are appropriately doped with impurities. Further, the source and drain and the channel (active regions) are surrounded by an isolation insulating layer (not shown), such as a shallow trench isolation (STI), made of, for example, silicon oxide.

An interfacial layer 103 is formed over the channel layer 101 in some embodiments. The interfacial layer 103 is made of silicon oxide having thickness in a range from about 0.5 nm to about 1.5 nm in some embodiments.

A ferroelectric dielectric layer 105 is disposed over the interfacial layer 103. The ferroelectric dielectric layer 105 includes a mixture of $HfO_2$ and an oxide of one or more metal elements selected from the group consisting of Zr, Al, La, Y, Gd and Sr (hereinafter may be referred to as HXO or $HfO_2:XO_2$, where X is Zr, Al, La, Y, Gd and/or Sr). In some embodiments, the ferroelectric dielectric layer 105 includes $HfO_2$ doped with Si and/or Zr. In certain embodiments, the ferroelectric dielectric 105 layer includes $Hf_{1-x}Zr_xO_2$ ($0<x<1$). In some embodiments, the ferroelectric dielectric layer 105 includes an amorphous layer and crystals. In other embodiments, the ferroelectric dielectric layer 105 includes a compressive strained oxide of hafnium and a metal element X, where X is one or more selected from the group consisting of Zr, Al, La, Y, Gd and Sr. The thickness of the ferroelectric dielectric layer 105 is in a range from about 1.0 nm to about 10 nm in some embodiments.

A gate electrode layer 106 is disposed over the ferroelectric dielectric layer 105. The gate electrode layer 106 includes one or more metallic layers. In some embodiments, the gate electrode layer 106 includes a first conductive layer (a capping layer) disposed on the ferroelectric dielectric layer 105, a second layer (a barrier layer) disposed on the first conductive layer, a third conductive layer (a work function adjustment layer) disposed on the second conductive layer, a fourth conductive layer (a glue layer) disposed on the third conductive layer and/or a fifth conductive layer (a main gate metal layer) disposed on the fourth conductive layer.

The capping layer includes a TiN based material, such as TiN and TiN doped with one or more additional elements. In some embodiments, the TiN layer is doped with Si. The barrier layer includes TaN in some embodiments. In certain embodiments, the capping layer is not utilized.

The work function adjustment layer includes one or more layers of conductive material, such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

The glue layer includes Ti, TiN and/or TaN in some embodiments. The main gate metal layer includes a metal selected from a group of W, Cu, Ti, Al and Co.

Further, sidewall spacers 109 are formed on opposing side faces of the gate structure as shown in FIG. 1A. The sidewall spacers 109 include one or more layers of insulating material, such as silicon oxide, silicon nitride and silicon oxynitride.

FIG. 1B shows a cross sectional view of a metal-insulator-semiconductor (MIS) FET-type NCFET in accordance with another embodiment. In FIG. 1B, the interfacial layer 103 has a flat shape, and the ferroelectric dielectric layer 105 is conformally formed in the gate space and has a height substantially equal to the height of the gate electrode layer 106.

In FIG. 1C, similar to FIGS. 1A and/or 1B, a channel 101 and source and drain 102 are formed on a substrate 100. A first gate dielectric layer 113 is disposed over the channel 101. The first gate dielectric layer 113 includes one or more high-k dielectric layers (e.g., having a dielectric constant greater than 3.9) in some embodiments. For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, SiN ($Si_3N_4$), $Al_2O_3$, $La_2O_3$, $Ta_2O_3$, $Y_2O_3$, $HfO_2$, $ZrO_2$, $GeO_2$, $Hf_xZr_{1-x}O_2$, $Ga_2O_3$, $Gd_2O_3$, $TaSiO_2$, $TiO_2$, HfSiON, $YGe_xO_y$, $YSi_xO_y$, and $LaAlO_3$, and the like. In certain embodiments, $HfO_2$, $ZrO_2$ and/or $Hf_xZr_{1-x}O_2$ is used. The formation methods of first gate dielectric layer 113 include molecular-beam deposition (MBD), atomic layer deposition (ALD), physical vapor deposition (PVD), chemical vapor deposition (CVD), and the like. In some embodiments, the first gate dielectric layer 113 has a thickness of about 1.0 nm to about 10.0 nm.

In some embodiments, an interfacial layer (not shown) may be formed over the channel 101 prior to forming the first gate dielectric layer 113, and the first gate dielectric layer 113 is formed over the interfacial layer.

A first gate electrode 114 as an internal electrode is disposed on the first gate dielectric layer 113. The first gate electrode 114 may be one or more metals, such as W, Cu, Ti, Ag, Al, TiAl, TiAlN, TaC, TaCN, TaSiN, Mn, Co, Pd, Ni, Re, Ir, Ru, Pt, and Zr. In some embodiments, the first gate electrode 114 includes one or more of TiN, WN, TaN, and Ru. Metal alloys such as Ti—Al, Ru—Ta, Ru—Zr, Pt—Ti, Co—Ni and Ni—Ta may be used and/or metal nitrides, such as $WN_x$, $TiN_x$, $MoN_x$, $TaN_x$, and $TaSi_xN_y$ may also be used. In some embodiments, at least one of W, Ti, Ta, TaN and TiN is used as the first gate electrode 114. In some embodiments, the first gate electrode 114 includes a work function adjustment layer.

A ferroelectric dielectric layer 115 is formed on the first gate electrode 114. The ferroelectric dielectric layer 115 has the same or similar composition/structures as the ferroelectric layer 105.

Further, a second gate electrode 116 as an external gate is disposed on the ferroelectric dielectric layer 115. The second gate electrode 116 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. The second gate electrode 116 is made of the same material as or different material from the first gate electrode 114. Further, sidewall spacers 119 are formed on opposing side faces of the gate structure as shown in FIG. 1C. The sidewall spacers 119 include one or more layers of insulating material, such as silicon oxide, silicon nitride and silicon oxynitride.

As shown in FIGS. 1A-1C, the ferroelectric dielectric layers 105 and 115 and the first gate dielectric layer 113 have a "U-shape" in the cross section, having a thin center portion and thick side portions in the vertical direction.

The ferroelectric dielectric layers 105 and 115 can be formed by various methods. In some embodiments, laminated layers of amorphous $HfO_2/XO_2$ can be deposited by ALD at a low temperature in a range from about 100° C. to about 300° C. In other embodiments, the temperature is in a range from about 100° C. to about 175° C. The thickness of the amorphous matrix (each layer) is in a range from about 1 nm to about 10 nm in some embodiments. Then, an annealing operation is performed to generate the nanocrystals of $HfO_2:XO_2$ in the amorphous matrix.

In other embodiments, an amorphous $HfO_2$ layer is formed by ALD, and then a metal layer containing one or more metal elements selected from the group consisting of Zr, Al, La, Y, Gd and Sr (element X) is deposited over the amorphous $HfO_2$ layer. Then, an annealing operation is performed to drive the metal elements into the amorphous $HfO_2$ layer to generate compressive strained $HfO_2:XO_2$ layer. The annealing can be performed in a oxidizing gas such as $O_2$.

Further, in other embodiments, an oxygen-deficient amorphous $HfO_2$ layer containing one or more metal elements selected from the group consisting of Zr, Al, La, Y, Gd and Sr (element X) is deposited by ALD over a conductive layer (e.g., a channel layer). Then, an annealing operation is performed in an oxygen containing atmosphere (e.g., $O_2$) to induce an lattice expansion and/or compressive strain of more than 20%. The process is repeated to form a ferroelectric layer 105 or 115, to maximize strain effects and to stabilize a ferroelectric phase.

Yet in other embodiments, ferroelectric dielectric layers 105 and 115 of $HfO_2:XO_2$ can be formed by a high pressure synthesis to produce strain effects to stabilize ferroelectric phases.

Figure 2A:
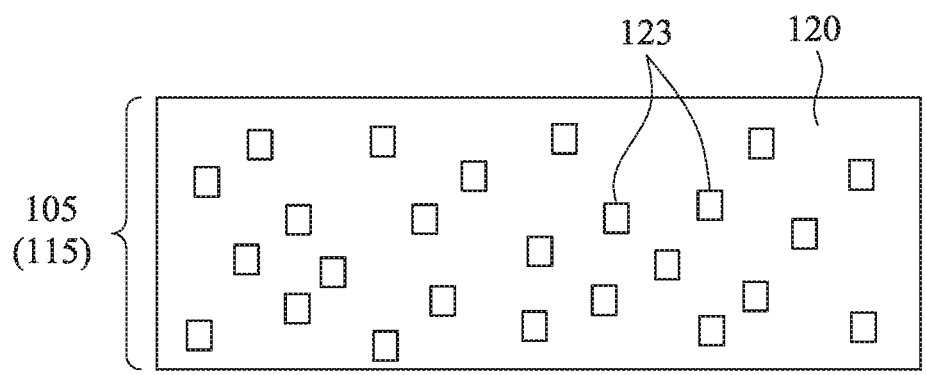
FIGS. 2A, 2B and 2C show various structures of a ferroelectric layer in accordance with embodiments of the present disclosure.
Figure 2B:
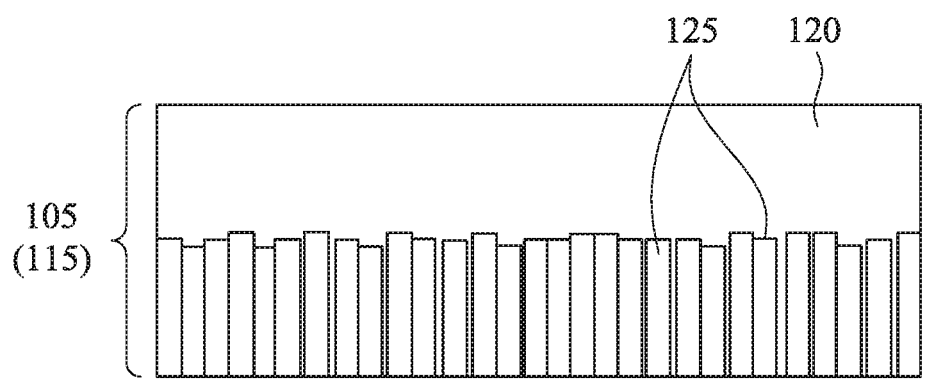
Figure 2C:
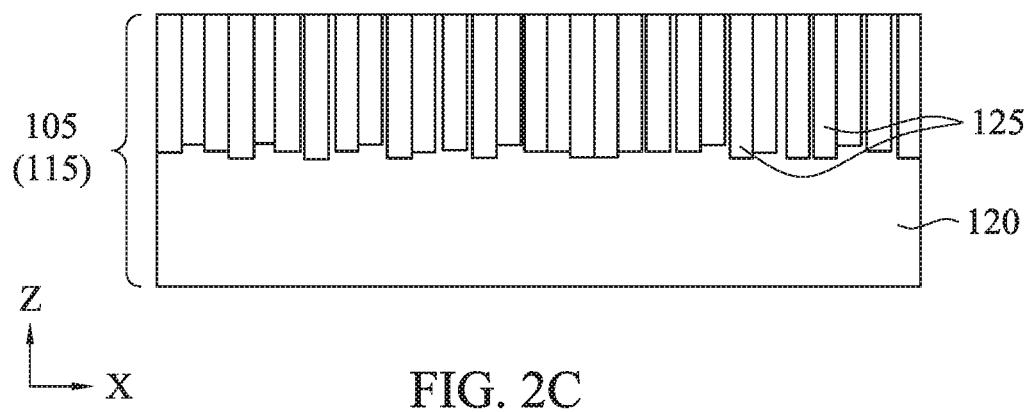

FIGS. 2A-2C show various structures of a ferroelectric layer in accordance with embodiments of the present disclosure. In FIGS. 2A-2C, the ferroelectric dielectric layer 105/115 includes an amorphous layer 120 and crystals 123, 125. In FIG. 2A, nanocrystals 123 of HXO are dispersed in the amorphous layer 120 of HXO. An average size of the nanocrystals is in a range from about 0.5 nm to about 5 nm in some embodiments. When the crystals are formed by $HfO_2:XO_2$, the crystals have orthorhombic structure. In FIGS. 2B and 2C, the crystals are columnar-shaped crystals 125. The columnar-shaped crystals 125 extend along a film stack direction (Z direction) and are embedded in the amorphous layer 120. An average diameter of the columnar shaped crystals is in a range from about 0.5 nm to about 5 nm, and an average length of the columnar shaped crystals is in a range from about 1 nm to 5 nm. In some embodiments, as shown in FIG. 2B, the columnar-shaped crystals are located closer to the underlying layer (e.g., a channel layer 101 of FIGS. 1A and 1B) such that a density of the crystals in the ferroelectric layer is larger in a region closer to the underlying layer than in a region closer to the overlying layer (e.g., a gate electrode layer 106 of FIGS. 1A and 1B). In other embodiments, as shown in FIG. 2C, the columnar-shaped crystals are located closer to the overlying layer such that a density of the crystals in the ferroelectric layer is larger in a region closer to the overlying layer than in a region closer to the underlying layer.

FIGS. 3A-3D show various stages of manufacturing operations for a negative capacitance structure in accordance with an embodiment of the present disclosure. It is understood that additional operations can be provided before, during, and after the processes shown by FIGS. 3A-3D, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-2C may be employed in the following embodiments, and detailed explanation thereof may be omitted.

Figure 3A:
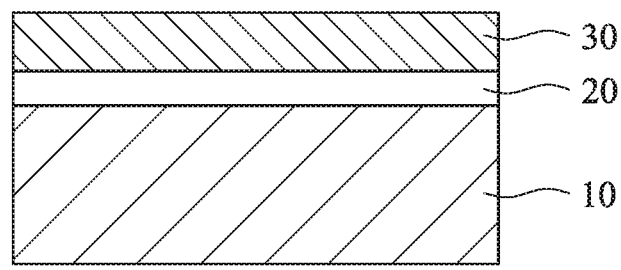
FIGS. 3A, 3B, 3C and 3D show various stages of manufacturing operations for a negative capacitance structure in accordance with an embodiment of the present disclosure.

As shown in FIG. 3A, an interfacial layer 20 is formed on a substrate 10. In some embodiments, the substrate 10 is made of a suitable elemental semiconductor, such as silicon, diamond or germanium; a suitable alloy or compound semiconductor, such as Group IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure.

In some embodiments, the interfacial layer 20 is a silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In some embodiments, the interfacial layer 20 has a thickness of about 0.5 nm to about 1.5 nm.

Then, a ferroelectric dielectric layer 30 is formed over the interfacial layer 20. The ferroelectric dielectric layer 30 includes an amorphous layer and crystals of $HfO_2$ and an oxide of a metal element, where the metal element is one or more selected from the group consisting of Zr, Al, La, Y, Gd and Sr, in some embodiments. In other embodiments, the ferroelectric dielectric layer 30 includes a compressive strained oxide of hafnium and a metal element X, where X is one or more selected from the group consisting of Zr, Al, La, Y, Gd and Sr. The ferroelectric dielectric layer 30 can be formed by the method as set forth above, in some embodiments.

In other embodiments, the formation methods of the dielectric layer 30 include molecular-beam deposition (MBD), atomic layer deposition (ALD), physical vapor deposition (PVD), chemical vapor deposition (CVD), and the like. In some embodiments, $HfO_2$ doped with Zr can be formed by ALD using $HfCl_4$ and $H_2O$ as a first precursor and $ZrCl_4$ and $H_2O$ as a second precursor at a temperature in a range from about 200° C. to 400° C. In a case of $HfO_2$ doped with Si, $SiH_4$, $Si_2H_6$, and/or $SiH_2Cl_2$ or other suitable silicon source gas may be used. The thickness of the dielectric layer 30 is in a range from about 1 nm to about 10 nm in some embodiments.

Figure 3B:
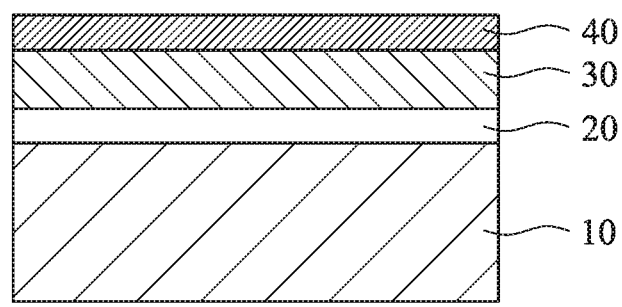
Figure 3C:
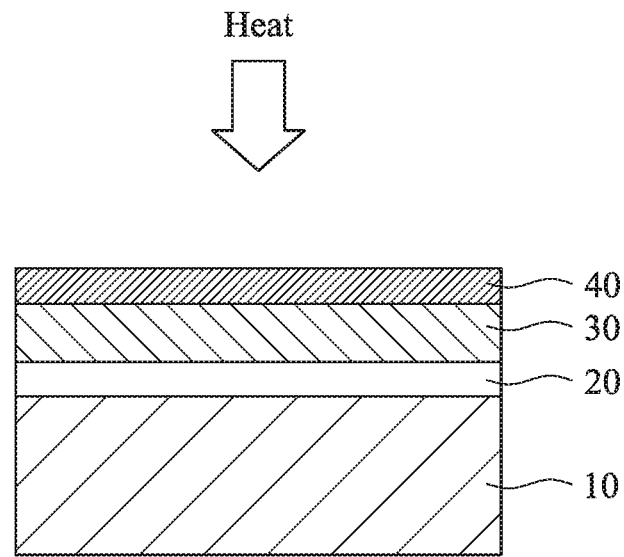

After the dielectric layer 30 is formed, a capping layer 40 is formed on the dielectric layer 30, as shown in FIG. 3B. The capping layer 40 includes a TiN based material, such as TiN and TiN doped with one or more additional elements, in some embodiments. In some embodiments, the TiN layer is doped with Si. The capping layer 40 can be formed by ALD, CVD or physical vapor deposition including sputtering or any other suitable methods. When ALD is utilized, the ALD is performed at a temperature in a range from about 400° C. to about 500° C. in some embodiments. The thickness of the capping layer 40 is in a range from about 1 nm to about 5 nm in some embodiments. After the capping layer 40 is formed, an annealing operation is performed as shown in FIG. 3C. The annealing operation is performed at a temperature in a range from about 600° C. to about 1000° C. in an inert gas ambient, such as $N_2$, Ar and/or He. The annealing period is in a range from about 10 sec to 1 min in some embodiments. After the annealing, a cooling operation is performed. In some embodiments, the substrate is cooled down to less than 100° C. or to room temperature (about 25° C.).

In some embodiments, the capping layer 40 and the annealing operation are not utilized.

Figure 3D:
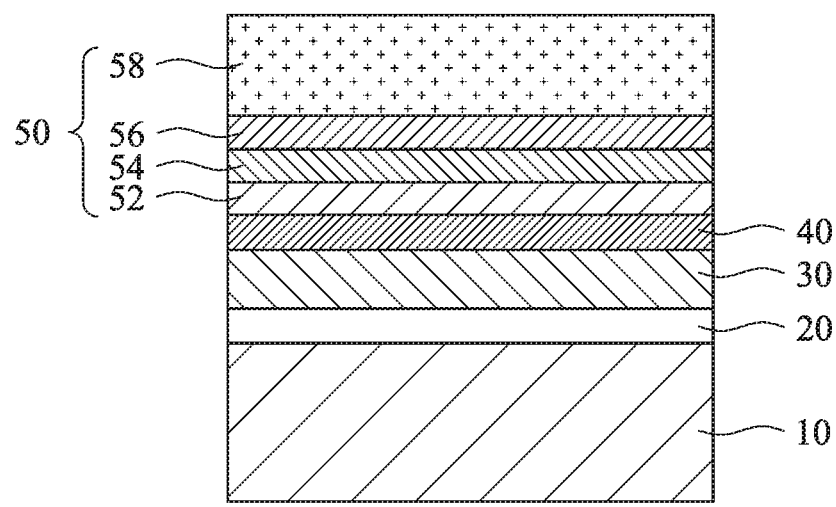
Figure 4A:
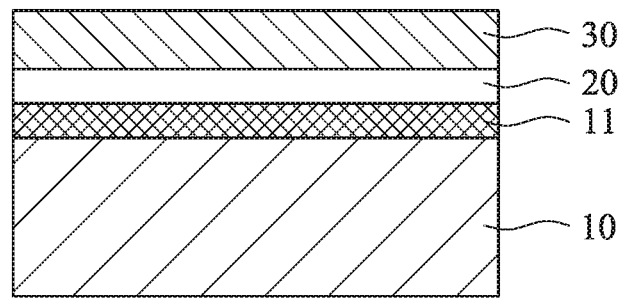
FIGS. 4A, 4B, 4C and 4D show various stages of manufacturing operations for a negative capacitance structure in accordance with an embodiment of the present disclosure.
Figure 4B:
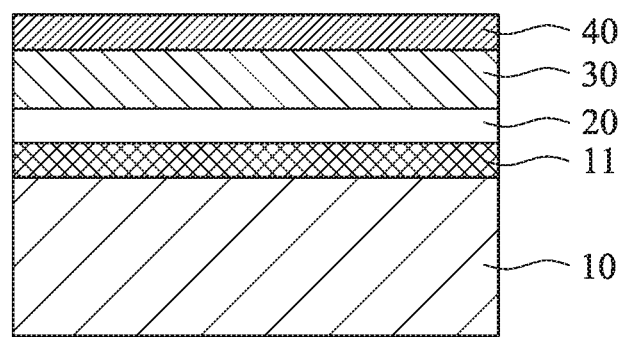
Figure 4C:
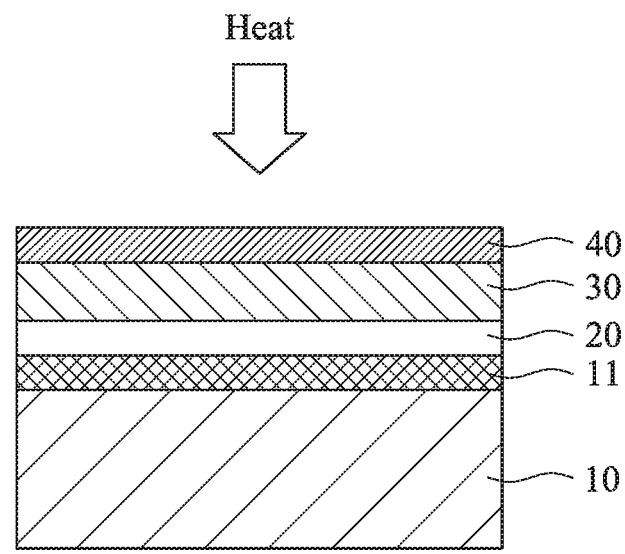
Figure 4D:
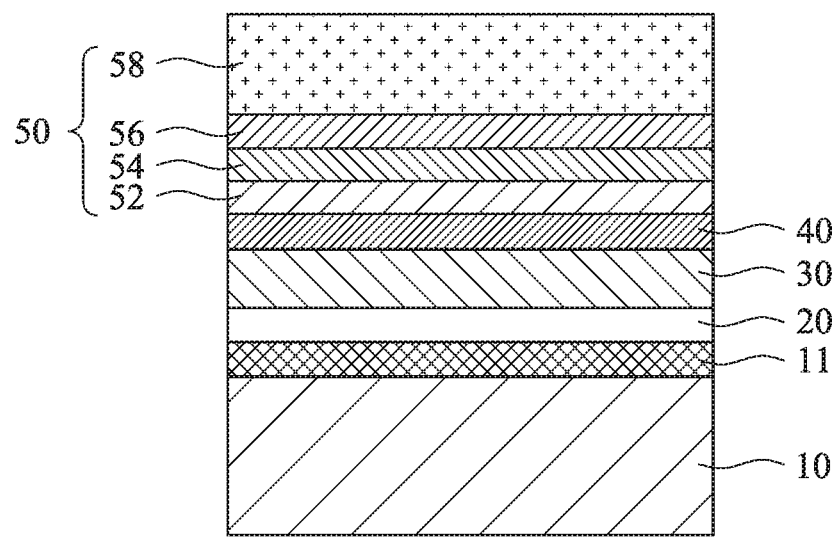

Then, a barrier layer 52 made of, for example, TaN, is formed over the capping layer 40, as shown in FIG. 3D. The barrier layer 52 can be formed by ALD, CVD or physical vapor deposition including sputtering or any other suitable methods. When ALD is utilized, the ALD is performed at a temperature in a range from about 300° C. to about 400° C. in some embodiments. The thickness of the barrier layer 52 is in a range from about 1 nm to about 5 nm in some embodiments. In some embodiments, the annealing operation to convert the amorphous structure to the orthorhombic structure may be performed after the barrier layer 52 is formed.

Further, a work function adjustment layer 54 is formed on the barrier layer 52. In some embodiments, the work function adjustment layer 54 includes TiN for a p-type transistor and TiAl for an n-type transistor. Any other suitable metallic material can be used as the work function adjustment layer 54. In some embodiments, a TiAl layer is also formed on a TiN work function adjustment layer for a p-type transistor. The work function adjustment layer 54 can be formed by ALD, CVD or physical vapor deposition including sputtering or any other suitable methods. When ALD is utilized, the ALD is performed at a temperature in a range from about 300° C. to about 400° C. in some embodiments. The thickness of the work function adjustment layer 54 is in a range from about 1 nm to about 5 nm in some embodiments.

Further, a main gate metal layer 58 is formed over the work function adjustment layer 54. The main gate metal layer 58 includes one or more metals, such as W, Cu, Ti, Al and Co, or other suitable material. In some embodiments, when the main gate metal layer 58 is W, a glue layer 56 is formed on the work function adjustment layer 54. In some embodiments, the glue layer 56 is Ti. As shown in FIG. 3D, the gate electrode 50 may include a barrier layer 52 disposed on the capping layer 40, a work function adjustment layer 54 disposed on the barrier layer 52, a glue layer 56 disposed on the work function adjustment layer 54 and a main gate metal layer 58. In some embodiments, the capping layer may be considered as a part of the gate electrode 50.

FIGS. 4A-4D show various stages of manufacturing operations for a negative capacitance structure in accordance with an embodiment of the present disclosure. It is understood that additional operations can be provided before, during, and after the processes shown by FIGS. 4A-4D, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-3D may be employed in the following embodiments, and detailed explanation thereof may be omitted.

In this embodiment, at least the surface portion of the substrate 10 includes an epitaxial semiconductor layer 11, made of the same as or different semiconductor material than the substrate 10. In certain embodiments, the epitaxial semiconductor layer 11 includes SiGe. The interfacial layer 20 is formed on the epitaxial semiconductor layer 11. The remaining manufacturing operations are the same as those explained with respect to FIGS. 3A-3D.

FIGS. 5A and 5B show various stages of manufacturing operations for a negative capacitance structure in accordance with an embodiment of the present disclosure. It is understood that additional operations can be provided before, during, and after the processes shown by FIGS. 5A and 5B, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-4D may be employed in the following embodiments, and detailed explanation thereof may be omitted.

In this embodiment, the initial dielectric layer includes alternately stacked one or more $HfO_2$ layer 30A and one or more $XO_2$ layers 30B, where X is one or more selected from the group consisting of Zr, Al, La, Y, Gd and Sr, formed over the interfacial layer 20, as shown in FIG. 5A. In some embodiments, the interfacial layer 20 is not used. In certain embodiments, an epitaxial semiconductor layer 11 is used in addition to or instead of the interfacial layer 20.

The stacked layer can be formed by ALD at a temperature in a range from 100° C. to 300° C. Each of the layers can be a monoatomic layer or multi-atomic layer (e.g., two or three or more monoatomic layers). Although FIG. 5A shows four layers of $HfO_2$ layer 30A and four layers of $XO_2$ layers 30B, the number of the layers is not limited to four, and it can be two, three or five or more.

After the annealing operations, the stacked layer of $HfO_2$ layer 30A and $XO_2$ layers 30B becomes a single amorphous layer of $HfO_2:XO_2$ in which nanocrystals 39 of $HfO_2:XO_2$ are dispersed, as shown in FIG. 5B. In certain embodiments, X is Zr. The temperature of the annealing is in a range from about 400° C. to about 800° C. in some embodiments.

FIGS. 5C and 5D show various stages of manufacturing operations for a negative capacitance structure in accordance with an embodiment of the present disclosure. It is understood that additional operations can be provided before, during, and after the processes shown by FIGS. 5C and 5D, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-5B may be employed in the following embodiments, and detailed explanation thereof may be omitted.

In this embodiments, the initial dielectric layer includes alternately stacked one or more $HfO_{2-x}$ layer 30C and one or more $XO_{2-y}$ layers 30D, where 0<x, y≤0.8 and X is one or more selected from the group consisting of Zr, Al, La, Y, Gd and Sr, formed over the interfacial layer 20, as shown in FIG. 5C. In some embodiments, the interfacial layer 20 is not used. In certain embodiments, an epitaxial semiconductor layer 11 is used in addition to or instead of the interfacial layer 20.

The stacked layer can be formed by ALD. Each of the layers can be a monoatomic layer or multi-atomic layer (e.g., two or three monoatomic layers). Although FIG. 5C shows four layers of $HfO_{2-x}$ layer 30C and four layers of $XO_{2-y}$ layers 30D, the number of the layers is not limited to four, and it can be two, three or five or more.

After the annealing operations in the oxidizing atmosphere (ozone and/or oxygen), the stacked layer of $HfO_{2-x}$ layer 30C and $XO_{2-y}$ layers 30D becomes a single amorphous layer of $HfO_2:XO_2$ in which nanocrystals 39 of $HfO_2:XO_2$ are dispersed, as shown in FIG. 5D. In certain embodiments, X is Zr.

FIGS. 6A-6D show various stages of manufacturing operations for a negative capacitance structure in accordance with an embodiment of the present disclosure. It is understood that additional operations can be provided before, during, and after the processes shown by FIGS. 6A-6D, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-5D may be employed in the following embodiments, and detailed explanation thereof may be omitted.

Figure 6A:
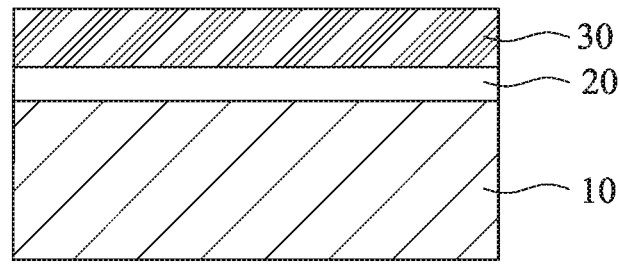
FIGS. 6A, 6B, 6C and 6D show various stages of manufacturing operations for a negative capacitance structure in accordance with an embodiment of the present disclosure.

In FIG. 6A, similar to FIG. 3A, an interfacial layer 20 is formed on a substrate 10, and a dielectric layer 30 is formed on the interfacial layer 20. In some embodiments, the substrate 10 includes an epitaxial layer 11 similar to FIG. 4A. The dielectric layer 30 includes amorphous $HfO_2$ formed by ALD in some embodiments.

Figure 6B:
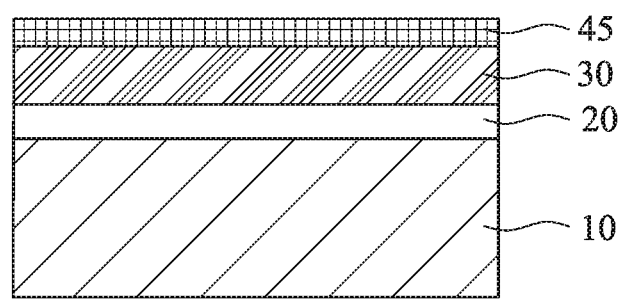
Figure 6C:
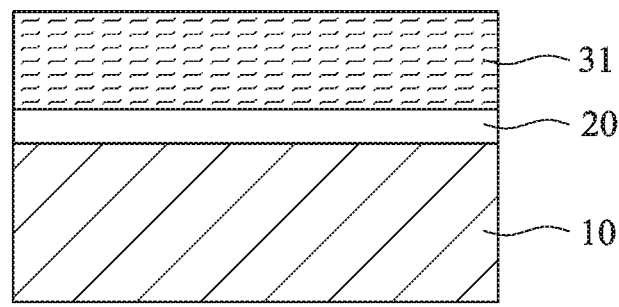

Then, as shown in FIG. 6B, a metal layer 45 containing one or more metal elements selected from the group consisting of Zr, Al, La, Y, Gd and Sr (element X) is deposited over the amorphous $HfO_2$ layer. Then, as shown in FIG. 6C, an annealing operation is performed to drive the metal elements into the amorphous $HfO_2$ layer to form compressive strained $HfO_2:XO_2$ layer 31. The annealing temperature (substrate temperature) is in a range from about 400° C. to about 800° C. in some embodiments. The annealing can be performed in an oxidizing gas such as $O_2$.

Figure 6D:
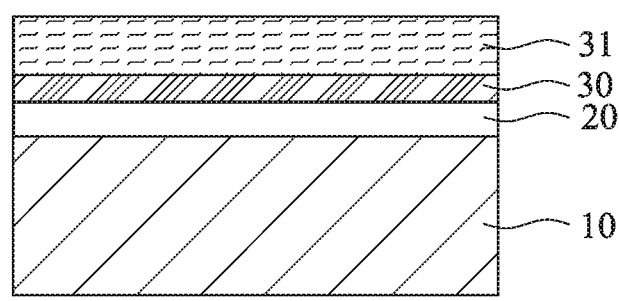

In some embodiments, only a part of the initial dielectric layer 30 becomes the compressive strained layer 31 as shown in FIG. 6D. In some embodiments, the initial dielectric layer 30 can be oxygen-deficient hafnium oxide ($HfO_{2-x}$, where 0<x≤0.8)

FIGS. 7A-7D show various stages of manufacturing operations for a negative capacitance structure in accordance with an embodiment of the present disclosure. It is understood that additional operations can be provided before, during, and after the processes shown by FIGS. 7A-7D, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-6D may be employed in the following embodiments, and detailed explanation thereof may be omitted.

As shown in FIG. 7A, similar to FIG. 3A, an interfacial layer 20 is formed on a substrate 10, and a dielectric layer 32 is formed on the interfacial layer 20. In some embodiments, the substrate 10 includes an epitaxial layer 11 similar to FIG. 4A. The dielectric layer 30 includes amorphous $HfO_2$ formed by ALD in some embodiments.

In this embodiment, the dielectric layer 32 is an oxygen-deficient amorphous hafnium oxide layer containing one or more metal elements selected from the group consisting of Zr, Al, La, Y, Gd and Sr (element X) deposited by ALD over a conductive layer (e.g., a channel layer). The oxygen-deficient hafnium oxide can be represented by $HfO_{2-x}$, where $0<x\leq0.8$.

Figure 7C:
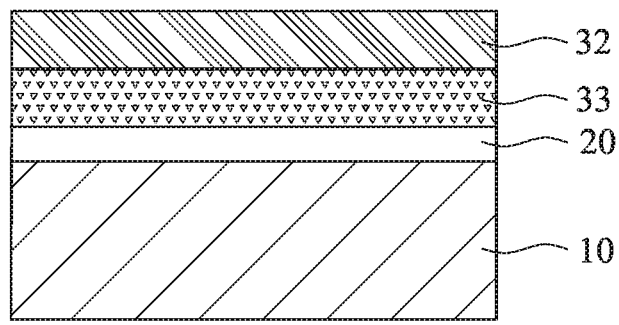
Figure 7D:
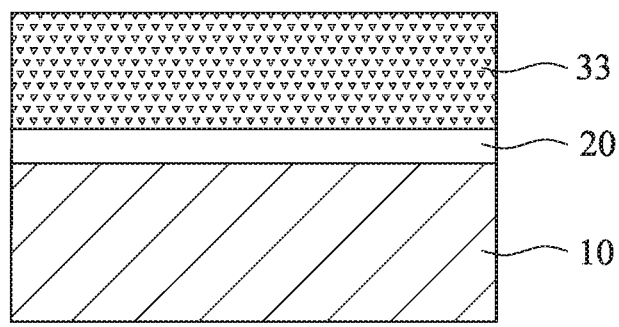

Then, an annealing operation is performed in an oxygen containing atmosphere (e.g., $O_2$) to induce an lattice expansion and/or compressive strain of more than 20%, as shown in FIG. 7B. The process is repeated, as shown in FIGS. 7C and 7D, to form a ferroelectric layer 33. Subsequently, a gate electrode is formed.

Figure 8A:
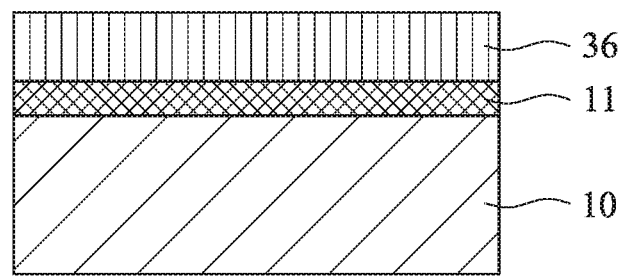
FIGS. 8A and 8B show various stages of manufacturing operations for a negative capacitance structure in accordance with an embodiment of the present disclosure.
Figure 8B:
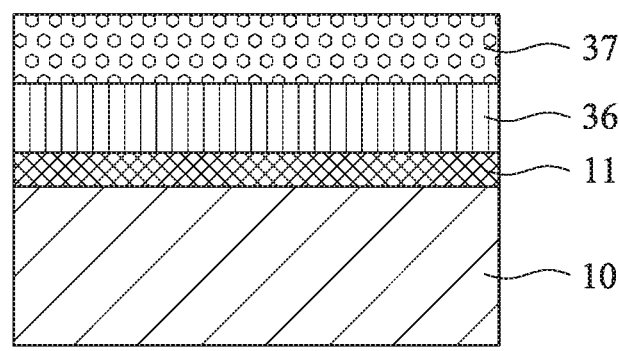

FIGS. 8A and 8B show various stages of manufacturing operations for a negative capacitance structure in accordance with an embodiment of the present disclosure. It is understood that additional operations can be provided before, during, and after the processes shown by FIGS. 8A and 8B, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-7D may be employed in the following embodiments, and detailed explanation thereof may be omitted.

In FIG. 8A, a layer 36 including columnar-shaped crystals is formed over an epitaxial layer 11. In some embodiments, the layer 36 including columnar-shaped crystals is formed over the substrate 10 without the epitaxial layer 11. In some embodiments, the columnar-shaped crystals can be formed by molecular-beam epitaxy (MBE), metal-organic CVD (MOCVD), rapid-melt growth, and liquid phase epitaxy (LPE) or any other epitaxial methods. By the epitaxial growth, columnar-shaped crystals of, for example, $HfO_2$:$XO_2$, can be formed on the Si or SiGe surface. Then, amorphous layer 37 is formed over the layer 36 including the columnar-shaped crystals, as shown in FIG. 8B.

Figure 8C:
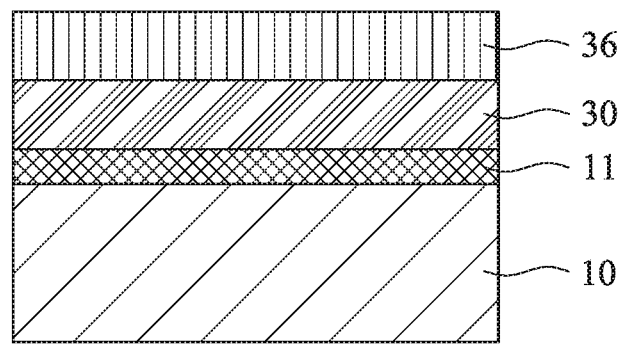
FIGS. 8C and 8D show various stages of manufacturing operations for a negative capacitance structure in accordance with an embodiment of the present disclosure.
Figure 8D:
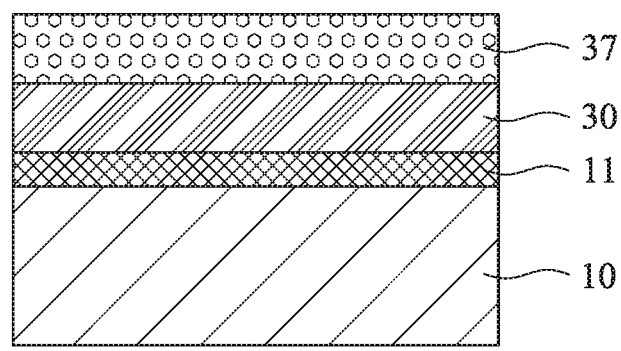

FIGS. 8C and 8D show various stages of manufacturing operations for a negative capacitance structure in accordance with an embodiment of the present disclosure. In FIG. 8C, a dielectric layer 30 is formed over an epitaxial layer 11. In some embodiments, the dielectric layer 30 is formed over the substrate 10 without the epitaxial layer 11. Then, a layer 36 including columnar-shaped crystals is formed over the dielectric layer 30, as shown in FIG. 8D. In some embodiments, an additional amorphous oxide layer is formed over the layer 36.

Figure 9:
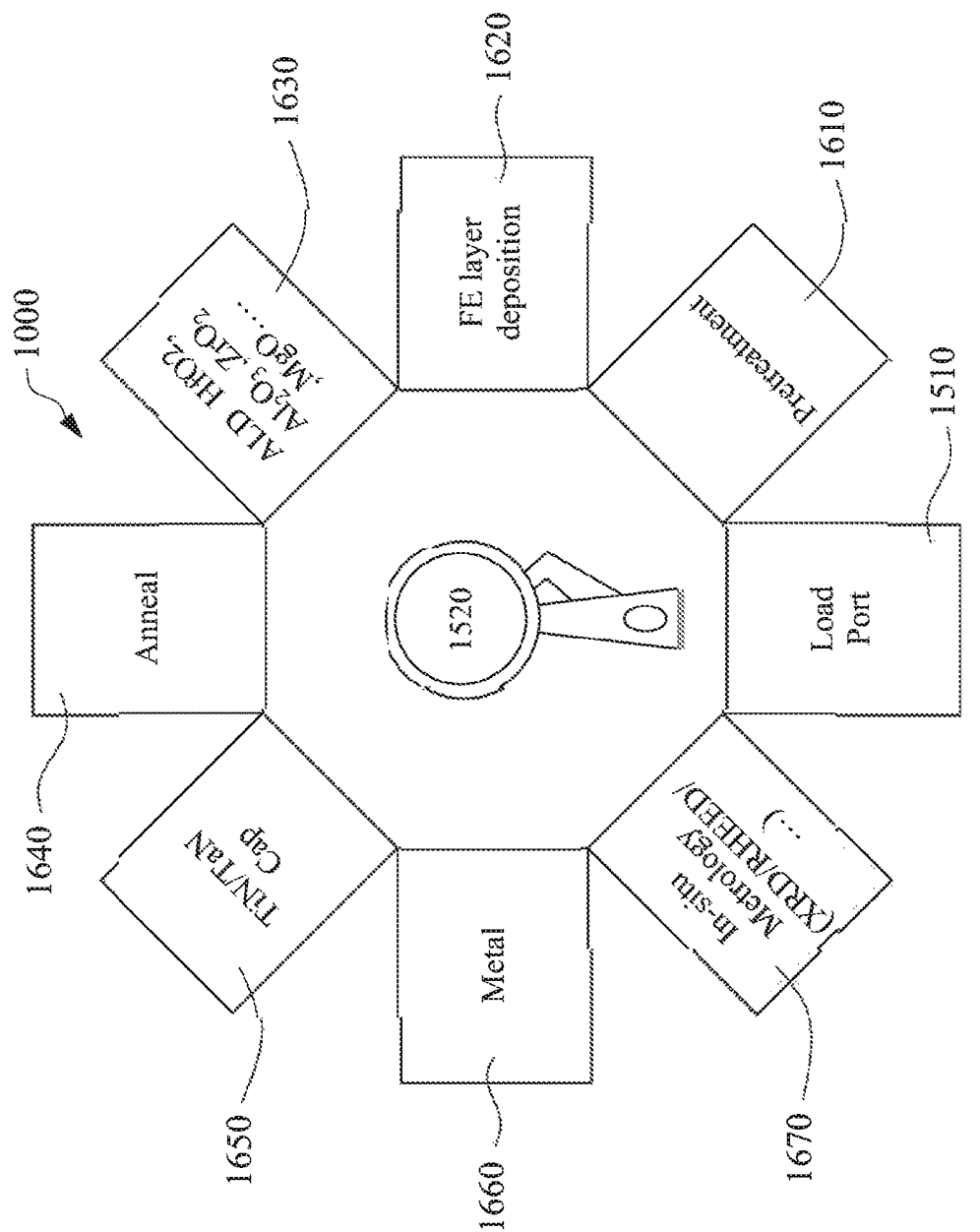
FIG. 9 shows a schematic view of a film formation apparatus according to an embodiment of the present disclosure.

FIG. 9 shows a schematic view of a film formation apparatus according to embodiments of the present disclosure.

FIG. 9 shows an integrated film deposition system 1500. The system include a loading port (load-lock system) 1510 and a wafer handling system 1520. Multiple chambers 1610-1670 are provided to be accessed by the wafer handling system 1520. In some embodiments, the ferroelectric material forming chamber (FE chamber) 1620 is provided, which can be the MBE chamber, CVD chamber, ALD chamber, PVD chamber or the like. A pre-treatment chamber 1610 is used to clean the surface of a wafer (substrate), an ALD chamber 1630 is used to form various oxide layers, an anneal chamber 1640 is used for thermal operations. A seed layer can be formed in the pre-treatment chamber 1610 or in the ALD chamber 1630. Metal deposition chambers 1650 and 1660 are used to form metallic layers, such as TiN, TaN, Ti, Ta, W, Zr, Al, La, Y, Gd, Sc, or any other metallic materials. Further, in some embodiments, a measurement chamber 1670 equipped with, for example, an x-ray diffraction (XRD) measurement apparatus measurement apparatus or any other measurement tools, is provided.

By using the system 1500 shown in FIG. 9, multiple layers of a gate structure for an NCFET and/or a regular FET can be formed. For example, a high-k dielectric layer made of, for example, $HfO_2$, for a regular FET can be formed by the operations including a pre-treatment in the pre-treatment chamber 1610 and ALD deposition of $HfO_2$ in the ALD chamber 1630, followed by optional annealing in the chamber 1640, a capping/barrier layer deposition over the $HfO_2$ layer in the chamber 1650, and gate metal deposition in the chamber 1660. A gate structure having a ferroelectric layer for an NCFET can be formed by the operations including a pre-treatment in the pre-treatment chamber 1610 and ferroelectric layer deposition in the FE chamber 1620, followed by optional annealing in the chamber 1640, a capping/barrier layer deposition over the $HfO_2$ layer in the chamber 1650, and gate metal deposition in the chamber 1660. In some embodiments, an additional oxide layer is formed in the ALD chamber 1630 after the ferroelectric layer is formed.

Further, a gate structure for an NCFET with an internal gate (see, FIG. 1C) can be formed by the operations including a pre-treatment in the pre-treatment chamber 1610, high-k dielectric layer deposition in the ALD chamber 1630, and an internal gate formation in the chamber 1660 and ferroelectric layer deposition in the FE chamber 1620, followed by optional annealing in the chamber 1640, a capping/barrier layer deposition over the $HfO_2$ layer in the chamber 1650, and gate metal deposition in the chamber 1660. In addition, a gate structure for an NCFET with a diffusion barrier between two ferroelectric layers can be formed by the operations including a pre-treatment in the pre-treatment chamber 1610, high-k dielectric layer deposition in the ALD chamber 1630, diffusion barrier layer deposition in the ALD chamber 1630 and ferroelectric layer deposition in the chamber 1620, followed by optional annealing in the chamber 1640, a capping/barrier layer deposition over the $HfO_2$ layer in the chamber 1650, and gate metal deposition in the chamber 1660. Moreover, a gate structure for an NCFET with the diffusion barrier and the internal gate electrode can be formed by the operations including a pre-treatment in the pre-treatment chamber 1610, dielectric layer deposition in the ALD chamber 1620, diffusion barrier layer deposition in the ALD chamber 1630, internal gate electrode formation in the chamber 1660, and ferroelectric layer deposition in the chamber 1620, followed by optional annealing in the chamber 1640, a capping/barrier layer deposition over the $HfO_2$ layer in the chamber 1650, and gate metal deposition in the chamber 1660.

In some embodiments, the nanocrystals and/or columnar-shaped crystals of HfXO consist of an orthorhombic crystal phase. In other embodiments, the HfXO crystals are substantially formed by an orthorhombic crystal phase. In such a case, the orthorhombic crystal phase is about 0.1% or more of the HfXO crystals, and the remaining phases may be amorphous, a monolithic phase, a cubic phase and/or a tetragonal phase.

FIGS. 10A-18C show one of various stages of manufacturing operations for an NCFET in accordance with an embodiment of the present disclosure. It is understood that additional operations can be provided before, during, and after the processes shown by FIGS. 10A-18C, and some of the operations described below are replaced or eliminated, for additional embodiments of the method. The order of the operations/processes may be interchangeable. Material, configuration, dimensions and/or processes the same as or similar to the foregoing embodiments described with FIGS. 1A-9 may be employed in the following embodiments, and detailed explanation thereof may be omitted.

Figure 10B:
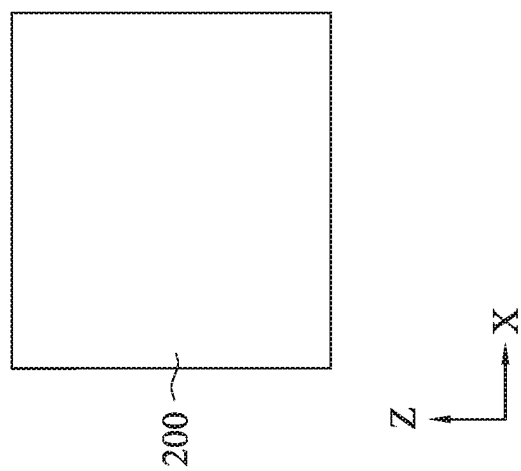
FIGS. 10A and 10B show one of various stages of manufacturing operations for an NCFET in accordance with an embodiment of the present disclosure.
Figure 10A:
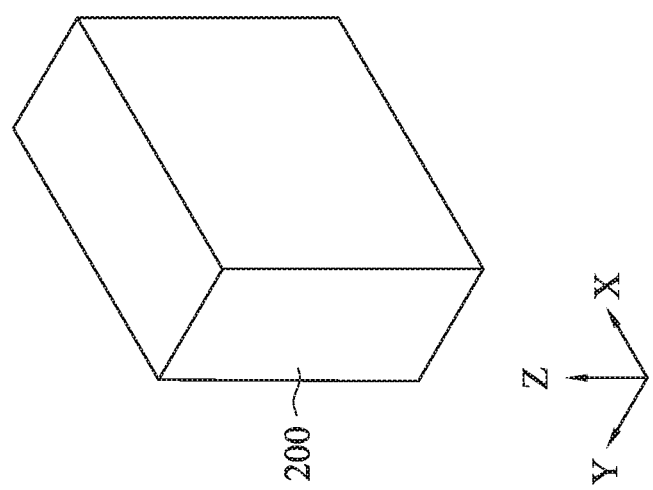

FIG. 10A shows a perspective view and FIG. 10B is a cross sectional view along the X direction, showing one of various stages of the manufacturing operation according to an embodiment of the present disclosure. As shown in FIGS. 10A and 10B, a substrate 200 is provided. In some embodiments, the substrate 200 is made of a suitable elemental semiconductor, such as silicon, diamond or germanium; a suitable alloy or compound semiconductor, such as Group IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 200 may include an epitaxial layer (epi-layer), which may be strained for performance enhancement, and/or may include a silicon-on-insulator (SOI) structure. The upper portion of the substrate 200 can be multi-layers of Si and SiGe.

Figure 11B:
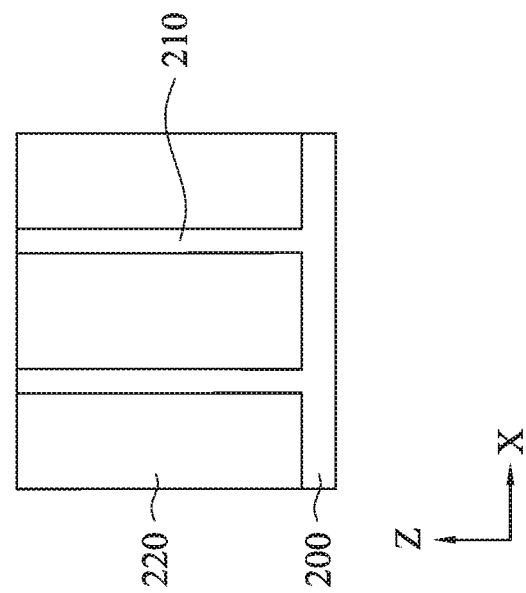
FIGS. 11A and 11B show one of various stages of manufacturing operations for an NCFET in accordance with an embodiment of the present disclosure.
Figure 11A:
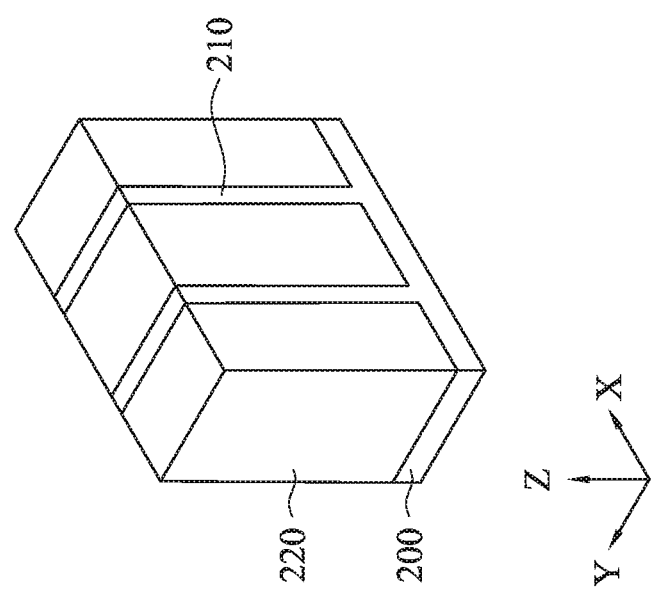

FIG. 11A shows a perspective view and FIG. 11B is a cross sectional view along the X direction, showing one of various stages of the manufacturing operation according to an embodiment of the present disclosure. As shown in FIGS. 11A and 11B, fin structures 210 are formed by etching the substrate 200 and forming an isolation insulating layer 220. The fin structures 210 may be patterned by any suitable method. For example, the fin structures 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures 210. In some embodiments, the width of the fin structures 210 is in a range from about 4 nm to about 10 nm and the pitch of the fin structures 210 is in a range from about 10 nm to about 50 nm.

Then, an insulating material layer 220 is formed over the fin structures, thereby embedding the fin structures. The insulating material layer 220 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the insulating material layer 220 is formed through a process such as CVD, flowable CVD (FCVD), or a spin-on-glass process, although any acceptable process may be utilized. Subsequently, portions of the insulating material layer 220 extending over the top surfaces of the fin structures 210 are removed using, for example, an etch process, chemical mechanical polishing (CMP), or the like, as shown in FIGS. 11A and 11B.

Figure 12B:
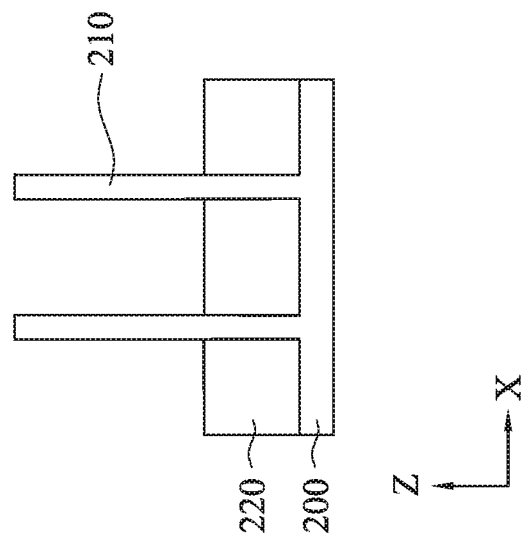
FIGS. 12A and 12B show one of various stages of manufacturing operations for an NCFET in accordance with an embodiment of the present disclosure.
Figure 12A:
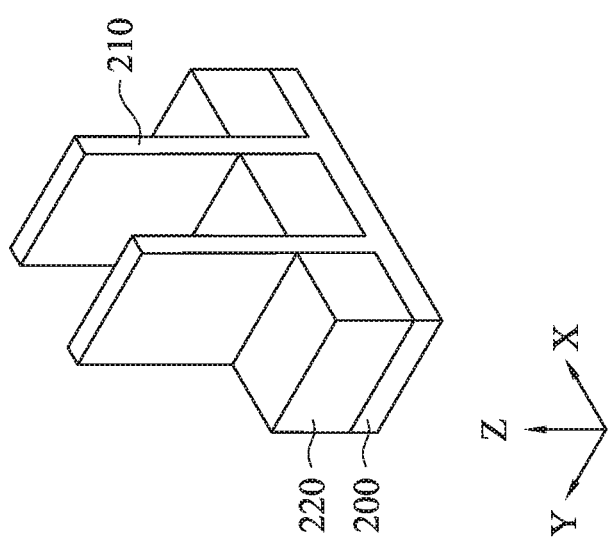

FIG. 12A shows a perspective view and FIG. 12B is a cross sectional view along the X direction, showing one of various stages of the manufacturing operation according to an embodiment of the present disclosure. Further, as shown in FIGS. 12A and 1B, the insulating material layer 220 is recessed so that the upper portions of the fin structures 210 are exposed. The recessed insulating material layer 220 is called an isolation insulating layer or a shallow trench isolation (STI). The height of the exposed fin structures 210 measured from the upper surface of the isolation insulating layer 220 is in a range about 30 nm to about 100 nm in some embodiments.

Figure 13B:
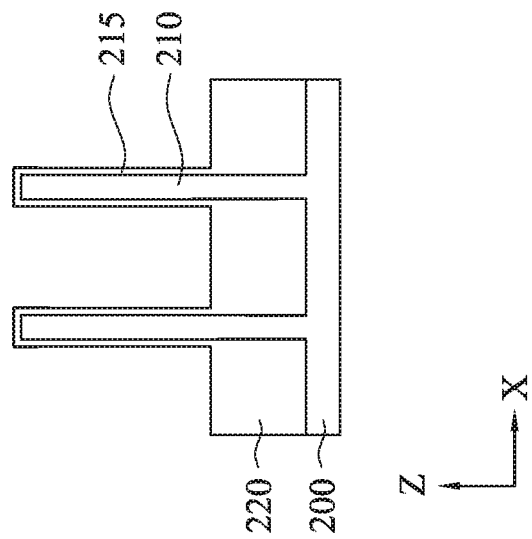
FIGS. 13A and 13B show one of various stages of manufacturing operations for an NCFET in accordance with an embodiment of the present disclosure.
Figure 13A:
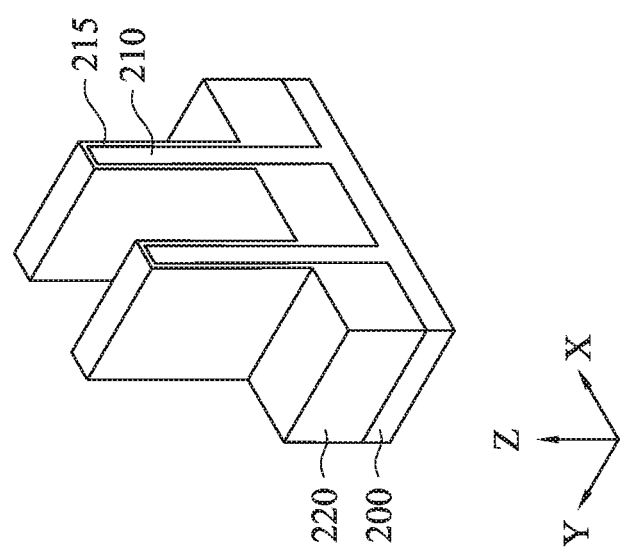

FIG. 13A shows a perspective view and FIG. 13B is a cross sectional view along the X direction, showing one of various stages of the manufacturing operation according to an embodiment of the present disclosure. Subsequently, a dummy gate dielectric layer 215 is formed over the upper portions of the fin structure 210, as shown in FIGS. 13A and 13B. The dummy gate dielectric layer 215 is a silicon oxide layer formed by CVD or ALD, in some embodiments. The thickness of the dummy gate dielectric layer 215 is in a range from about 1 nm to about 10 nm in some embodiments.

Figure 14C:
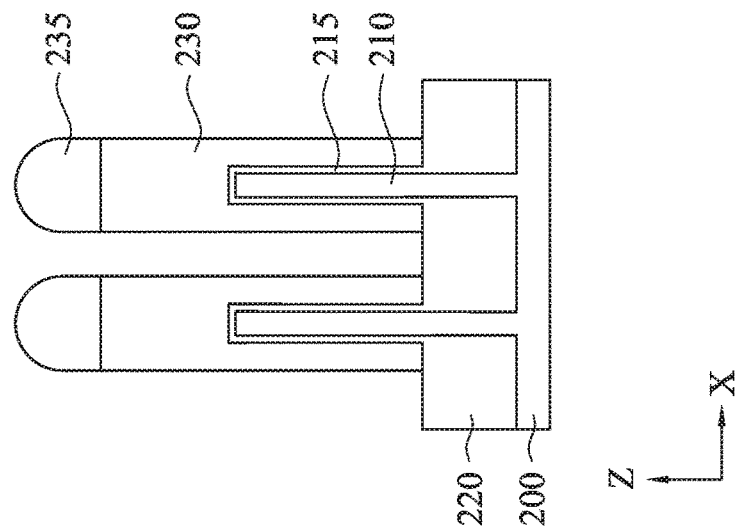
FIGS. 14A, 14B and 14C show one of various stages of manufacturing operations for an NCFET in accordance with an embodiment of the present disclosure.
Figure 14B:
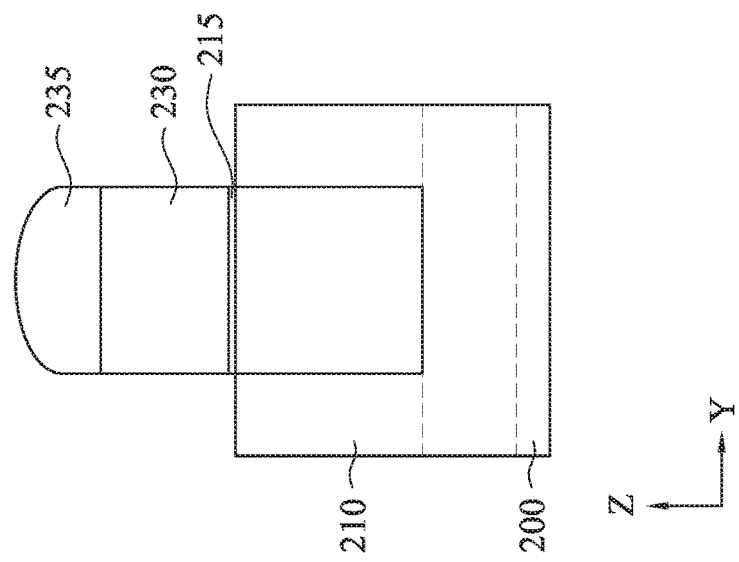
Figure 14A:
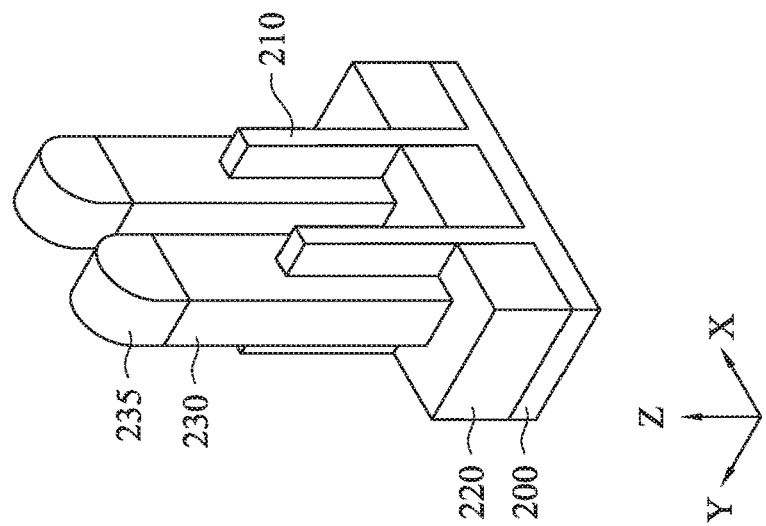

Then, a polysilicon layer 230 is formed over the dummy gate electrode layer 215, and further a hard mask layer is formed on the polysilicon layer. The hard mask layer is patterned into hard mask pattern 235 by suitable lithography and etching operations, as shown in FIGS. 14A-14C. The hard mask pattern 235 includes one or more layers of insulating material, such as silicon oxide and silicon nitride, in some embodiments.

FIG. 14A shows a perspective view, FIG. 14B is a cross sectional view along the Y direction and FIG. 14C is a cross sectional view along the X direction, showing one of various stages of the manufacturing operation according to an embodiment of the present disclosure. By using the hard mask pattern 235 as an etching mask, the polysilicon layer is patterned into dummy gate electrodes 230, as shown in FIGS. 14A-14C. In some embodiments, the width of the dummy gate electrode 230 is in a range from about 8 nm to about 20 nm.

Figure 15C:
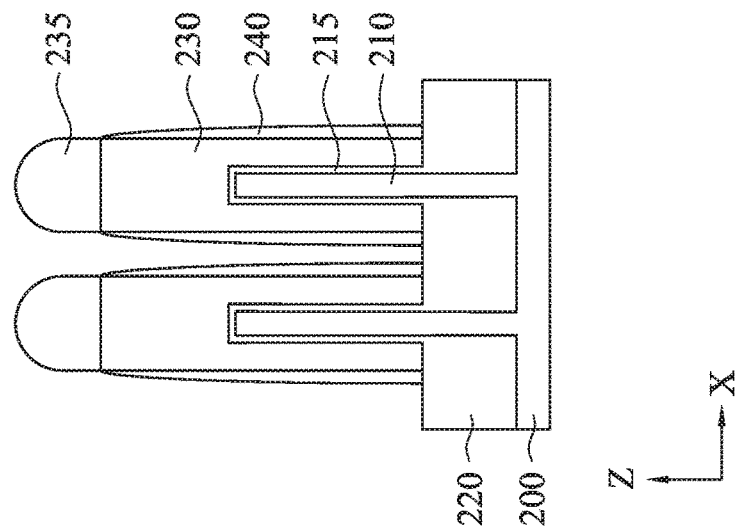
FIGS. 15A, 15B and 15C show one of various stages of manufacturing operations for an NCFET in accordance with an embodiment of the present disclosure.
Figure 15B:
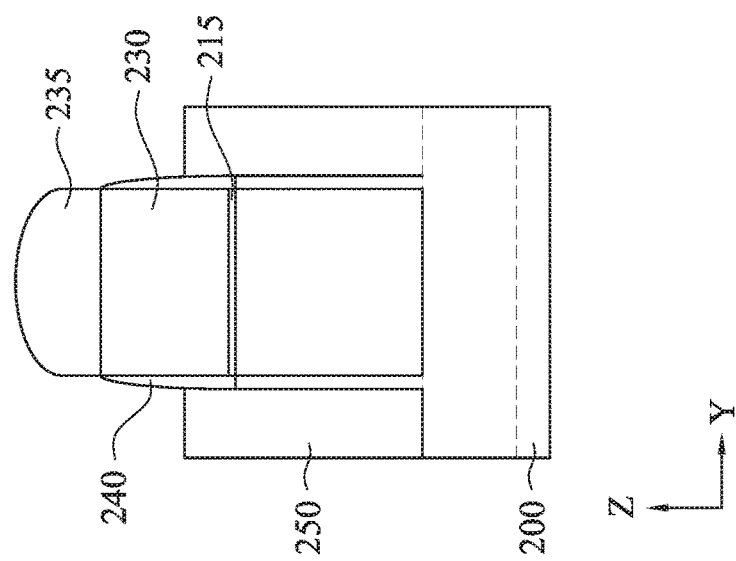
Figure 15A:
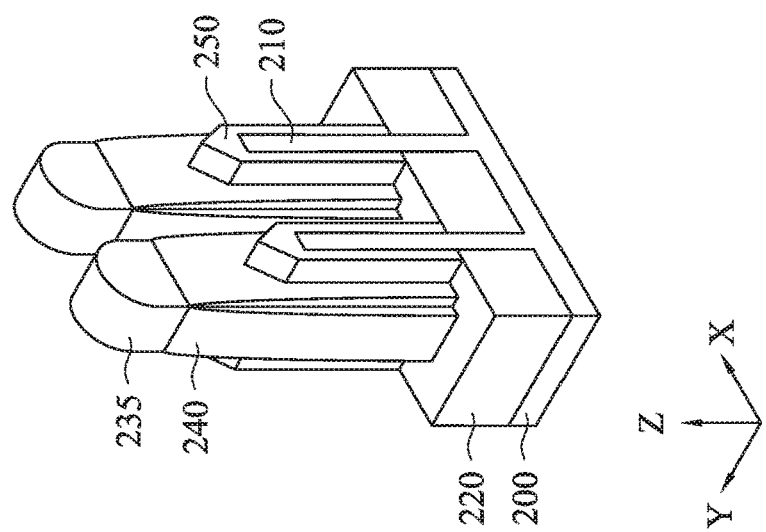

FIG. 15A shows a perspective view, FIG. 15B is a cross sectional view along the Y direction and FIG. 15C is a cross sectional view along the X direction, showing one of various stages of the manufacturing operation according to an embodiment of the present disclosure. Sidewall spacers 240 are formed on opposing side faces of the dummy gate electrodes 230. The sidewall spacers 240 include one or more layers of insulating material, such as silicon oxide, silicon nitride and silicon oxynitride. Moreover, source/drain epitaxial layers 250 are formed over source/drain regions of the fin structures 210. The source/drain epitaxial layers 250 include SiP, SiAs, SiGeP, SiGeAs, GeP, GeAs, and/or SiGeSn or other suitable material for an n-type FET, and SiB, SiGa, SiGeB, SiGeGa, GeB, GeGa and/or SiGeSn or other suitable material for a p-type FET. The thickness of the source/drain epitaxial layers 250 is in a range from about 3 nm to about 8 nm in some embodiments. In some embodiments, an alloy layer, such as a silicide layer, is formed over the source/drain epitaxial layers 250.

FIG. 16A shows a perspective view, FIG. 16B is a cross sectional view along the Y direction and FIG. 16C is a cross sectional view along the X direction, showing one of various stages of the manufacturing operation according to an embodiment of the present disclosure. Subsequently, an etch stop layer (ESL) 245 and an interlayer dielectric layer 260 are formed, and a planarization operation, such as a CMP operation, is performed to exposed upper surfaces of the dummy gate electrodes 230, as shown in FIGS. 16A-16C.

In some embodiments, the ESL layer 245 is made of a silicon nitride based material, such as SiN and SiON, and the interlayer dielectric layer 260 is made of a silicon oxide based material, such as $SiO_2$ or a low-k material. In some embodiments, an annealing operation is performed after the interlayer dielectric layer is formed.

Figure 17C:
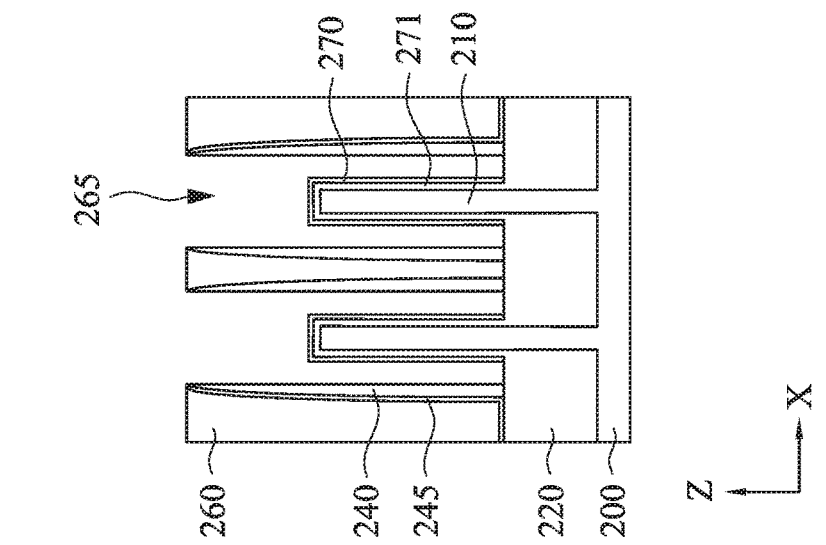
FIGS. 17A, 17B and 17C show one of various stages of manufacturing operations for an NCFET in accordance with an embodiment of the present disclosure.
Figure 17B:
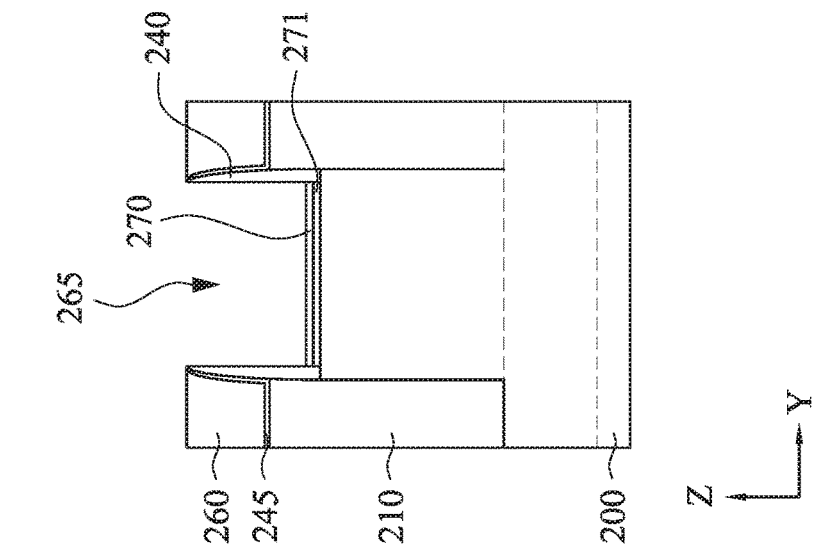
Figure 17A:
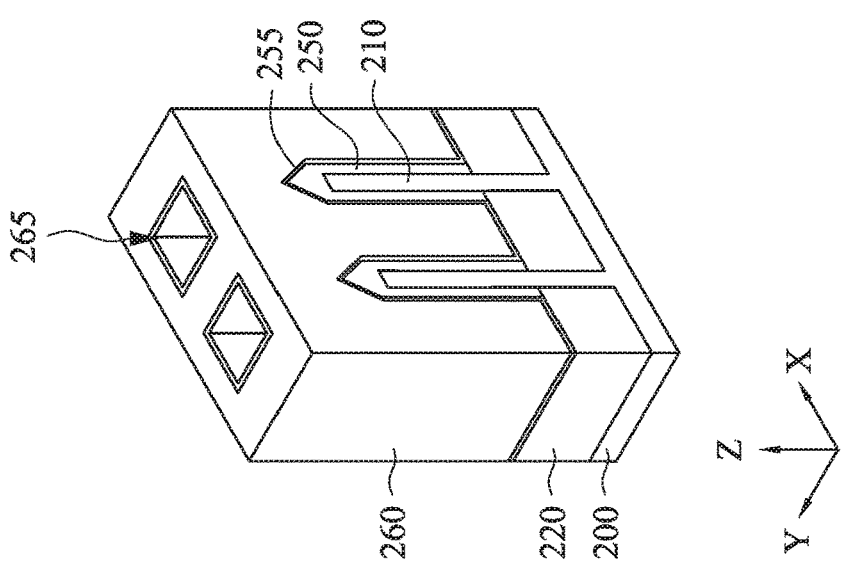

FIG. 17A shows a perspective view, FIG. 17B is a cross sectional view along the Y direction and FIG. 17C is a cross sectional view along the X direction, showing one of various stages of the manufacturing operation according to an embodiment of the present disclosure. Then, the dummy gate electrodes 230 and the dummy gate dielectric layer 215 are removed by using dry and/or wet etching, thereby forming gate spaces 265, as shown in FIGS. 17A-17C. Further, in the gate spaces 265, an interfacial layer 271 and a dielectric layer 270 are formed as shown in FIGS. 17A-17C. As set forth above, the interfacial layer 271 is made of silicon oxide, and the dielectric layer 270 is a ferroelectric layer formed by one of the aforementioned methods. Then, a capping layer (not shown) may optionally be formed, and an annealing operation may optionally be performed.

Figures 18A, 18B, 18C:
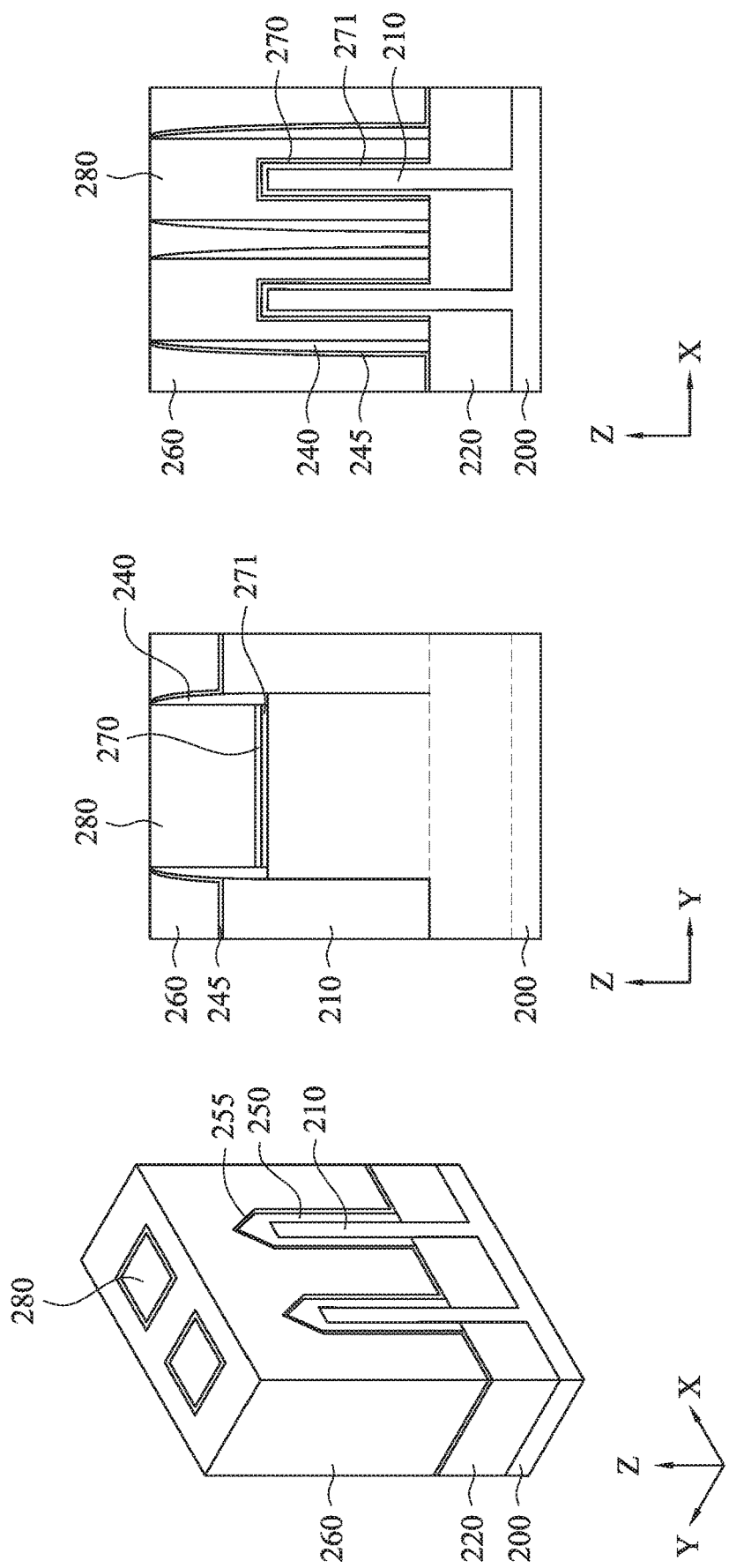
FIGS. 18A, 18B and 18C show one of various stages of manufacturing operations for an NCFET in accordance with an embodiment of the present disclosure.

FIG. 18A shows a perspective view, FIG. 18B is a cross sectional view along the Y direction and FIG. 18C is a cross sectional view along the X direction, showing one of various stages of the manufacturing operation according to an embodiment of the present disclosure. A gate electrode 280 is formed, as shown in FIGS. 18A-18C. The capping layer and the gate electrode may be formed using a suitable process such as ALD, CVD, PVD, plating, or combinations thereof. After the conductive materials for the gate electrode are formed, a planarization operation, such as CMP, is performed to remove excess materials above the interlayer dielectric layer 260.

After forming the gate structures, further CMOS processes are performed to form various features such as additional interlayer dielectric layers, contacts/vias, interconnect metal layers, and passivation layers, etc.

FIGS. 19-29C show other manufacturing operations for an NC FinFET in accordance with some embodiments of the present disclosure. Throughout the various views and illustrative embodiments, like reference numbers are used to designate like elements. It is understood that additional operations can be provided before, during, and after processes shown by FIGS. 19-29C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-18C may be employed in the following embodiments, and detailed explanation thereof may be omitted.

Figure 19:
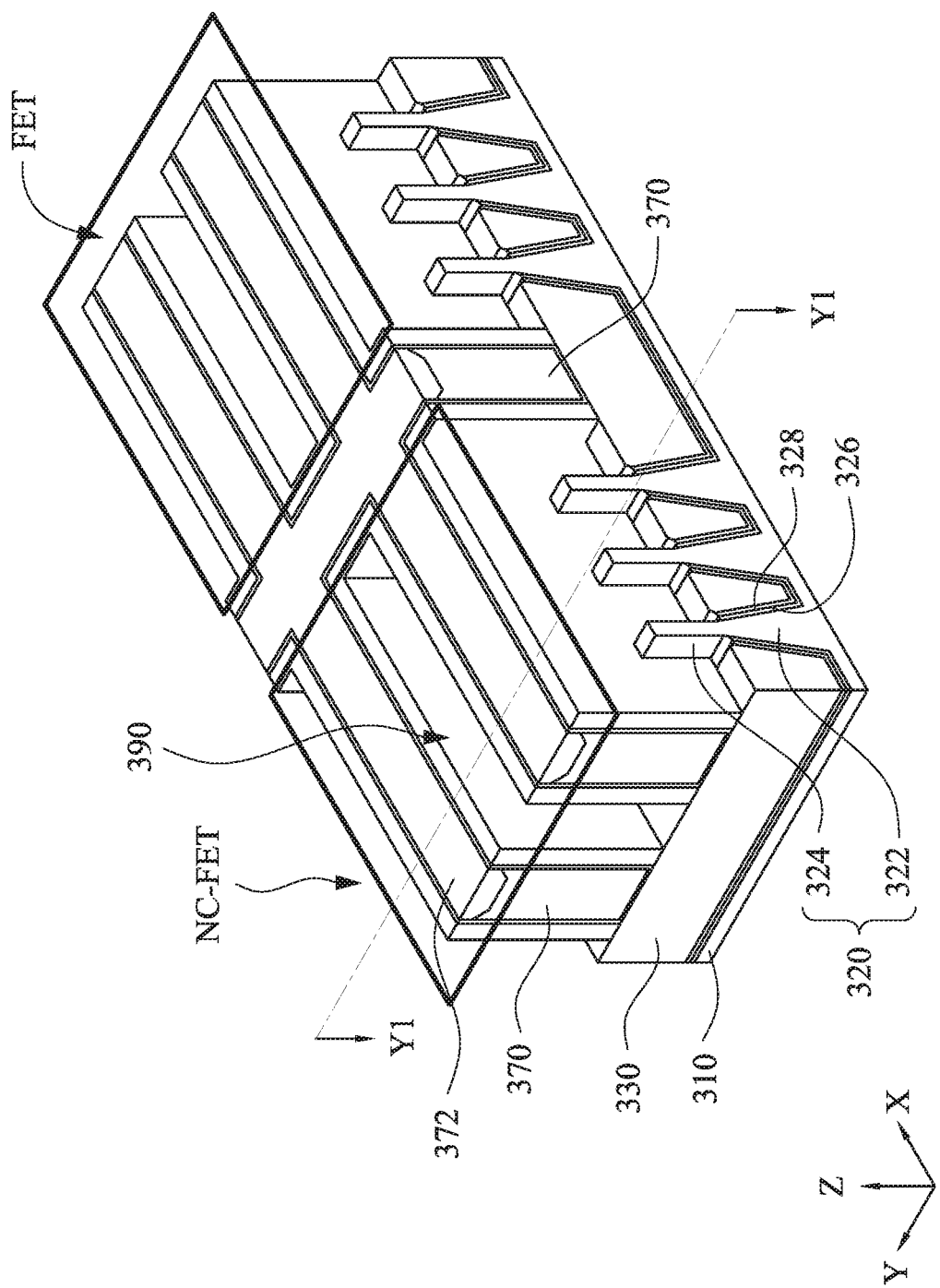
FIG. 19 shows one of various stages of manufacturing operations for an NCFET and a FET in accordance with another embodiment of the present disclosure.

FIG. 19 shows an exemplary perspective view after gate spaces 390 are formed by removing the dummy gate electrode and the dummy gate dielectric layer. In FIG. 19, the structure for an NC-FET and the structure for a regular FinFET are disposed adjacent to each other with a first ILD layer 370 interposed therebetween. Of course, the structure for the NC-FET and the structure for the regular FinFET may not necessarily be disposed adjacent to each other.

After the dummy gate electrode and the dummy gate dielectric layer are removed, upper portions 324 of the fin structures 320, which become channels, are exposed in the gate spaces 390, while lower portions 322 of the fin structures 320 are embedded in the isolation insulating layer 330. In some embodiments, a first fin liner layer 326 is formed on the lower portions 322 of the fin structures 320, and a second fin liner layer 328 is formed on the first fin liner layer 326. Each of the liner layers has a thickness between about 1 nm and about 20 nm in some embodiments. In some embodiments, the first fin liner layer 326 includes silicon oxide and has a thickness between about 0.5 nm and about 5 nm, and the second fin liner layer 328 includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 20:
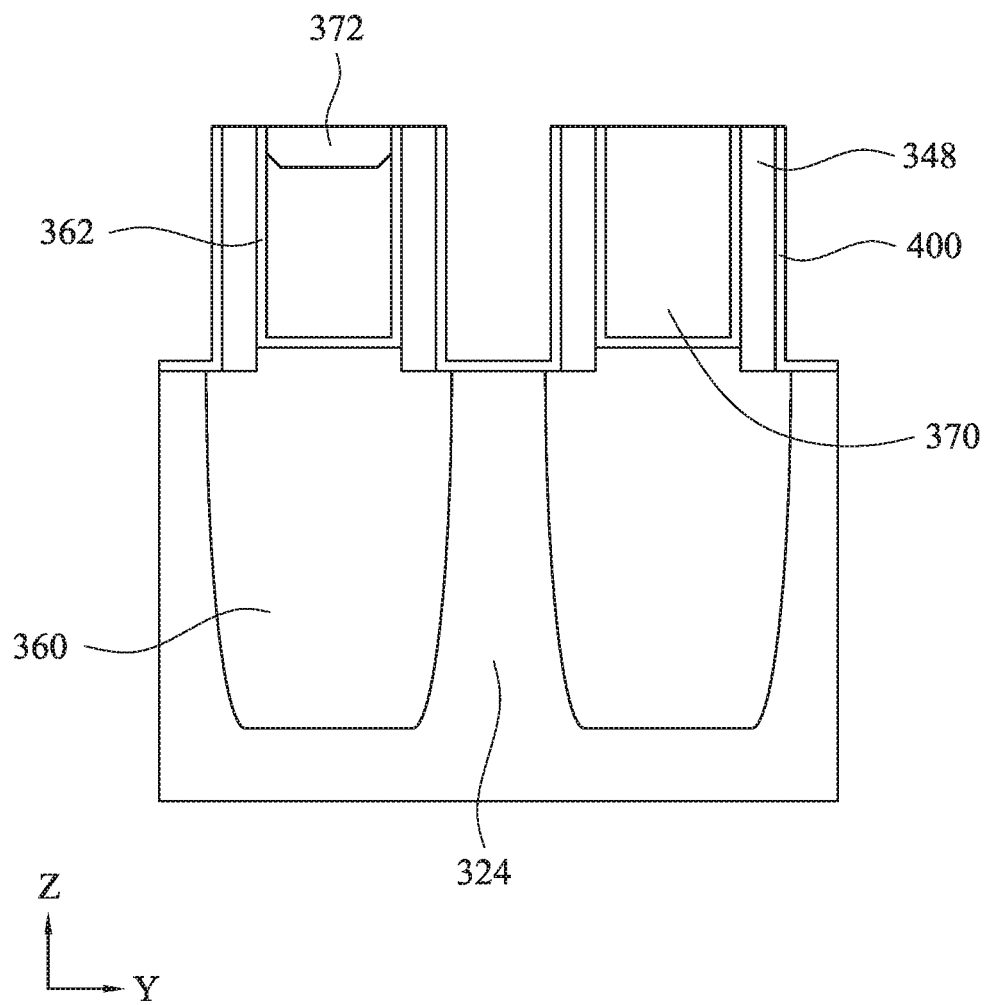
FIG. 20 shows one of various stages of manufacturing operations for an NCFET and a FET in accordance with another embodiment of the present disclosure.

After the dummy gate electrode and the dummy gate dielectric layer are removed, a gate dielectric layer 400 is conformally formed over the upper portions 324 (channels) of the fin structures, side faces of the insulating structure including the ILD layer 370, the sidewall spacers 348 and the dielectric layer 372, as shown in FIG. 20. FIG. 20 is the cross sectional view corresponding the line Y1-Y1 of FIG. 19. A source/drain region 360 is also formed below the ILD layer 370 by ion implantation and/or epitaxial growth methods.

In some embodiments, the gate dielectric layer 400 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, $GeO_2$, $ZrO_2$, $HfZrO_2$, $Ga_2O_3$, $Gd_2O_3$, $TaSiO_2$, $TiO_2$. HfSiON, $YGe_xO_y$, $YSi_xO_y$ and $LaAlO_3$, and the like. The formation methods of gate dielectric layer 400 include molecular-beam deposition (MBD), ALD, PVD, and the like. In some embodiments, the gate dielectric layer 400 has a thickness of about 0.5 nm to about 5 nm.

In some embodiments, an interfacial layer (not shown) may be formed over the channels 324 prior to forming the gate dielectric layer 400, and the gate dielectric layer 400 is formed over the interfacial layer. The interfacial layer helps buffer the subsequently formed high-k dielectric layer from the underlying semiconductor material. In some embodiments, the interfacial layer is a chemical silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In an embodiment, the interfacial layer has a thickness of about 0.2 nm to about 1 nm.

Figure 21:
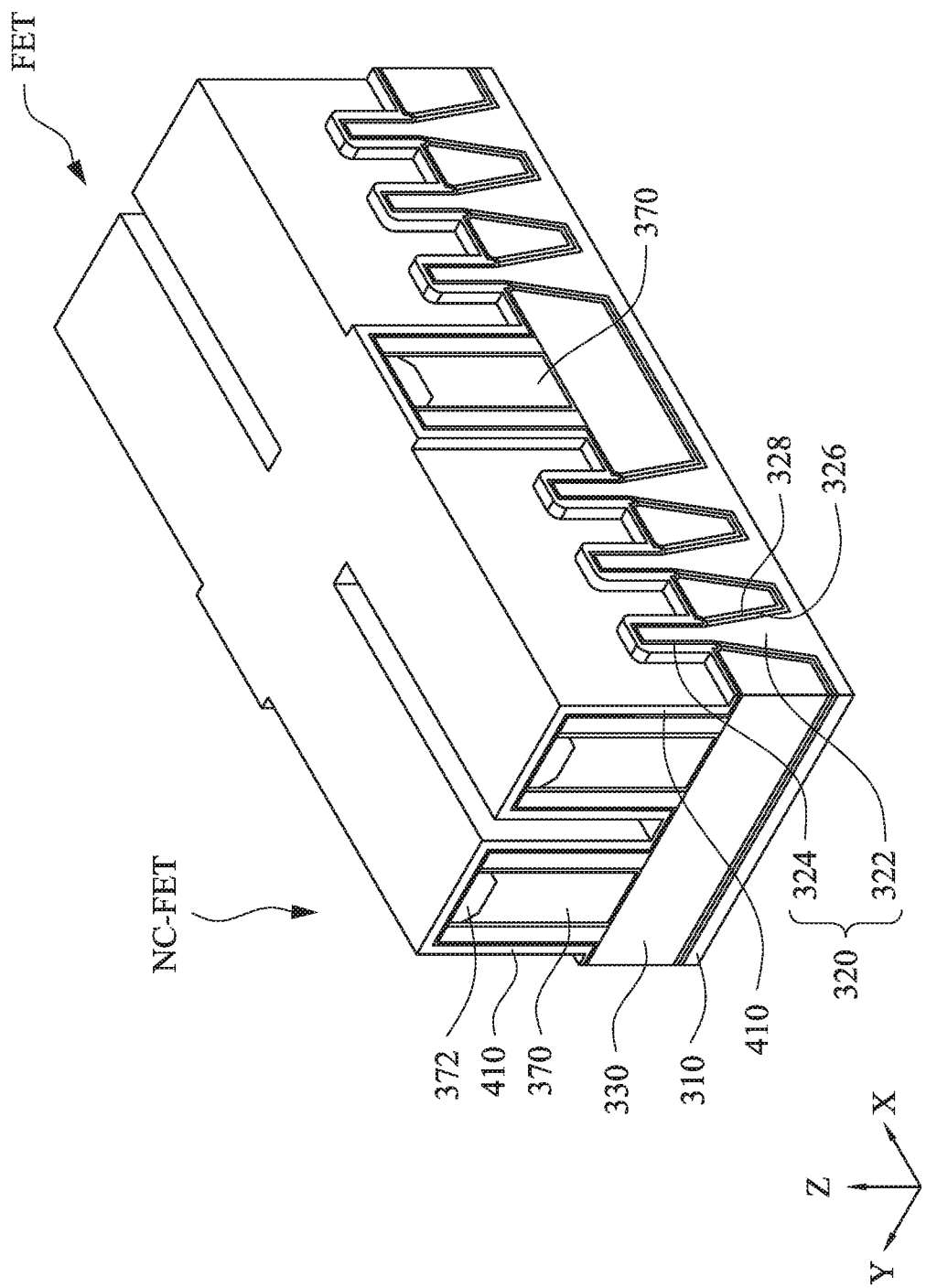
FIG. 21 shows one of various stages of manufacturing operations for an NCFET and a FET in accordance with another embodiment of the present disclosure.

Subsequently, a work function adjustment metal (WFM) layer 410 is formed over the gate dielectric layer 400, as shown in FIG. 21.

The WFM layer 410 is made of one or more layers of conductive material, such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

The thickness and the material of the WFM layer 410 can be selected for the types (p or n) of FETs and operational voltages. When the thickness is WFM layer 410 is small with respect to the aspect ratio of the gate space 390, the WFM layer 410 can be conformally formed on the bottom and the sides of the gate space 90 on which the gate dielectric layer 400 is formed, such that the gate space 90 is not filled with the WFM layer 410, as shown in FIG. 21. When the thickness is WFM layer 410 is large with respect to the aspect ratio of the gate space 390, the WFM layer 410 fills the gate space 390 on which the gate dielectric layer 400 is formed.

Figure 22A:
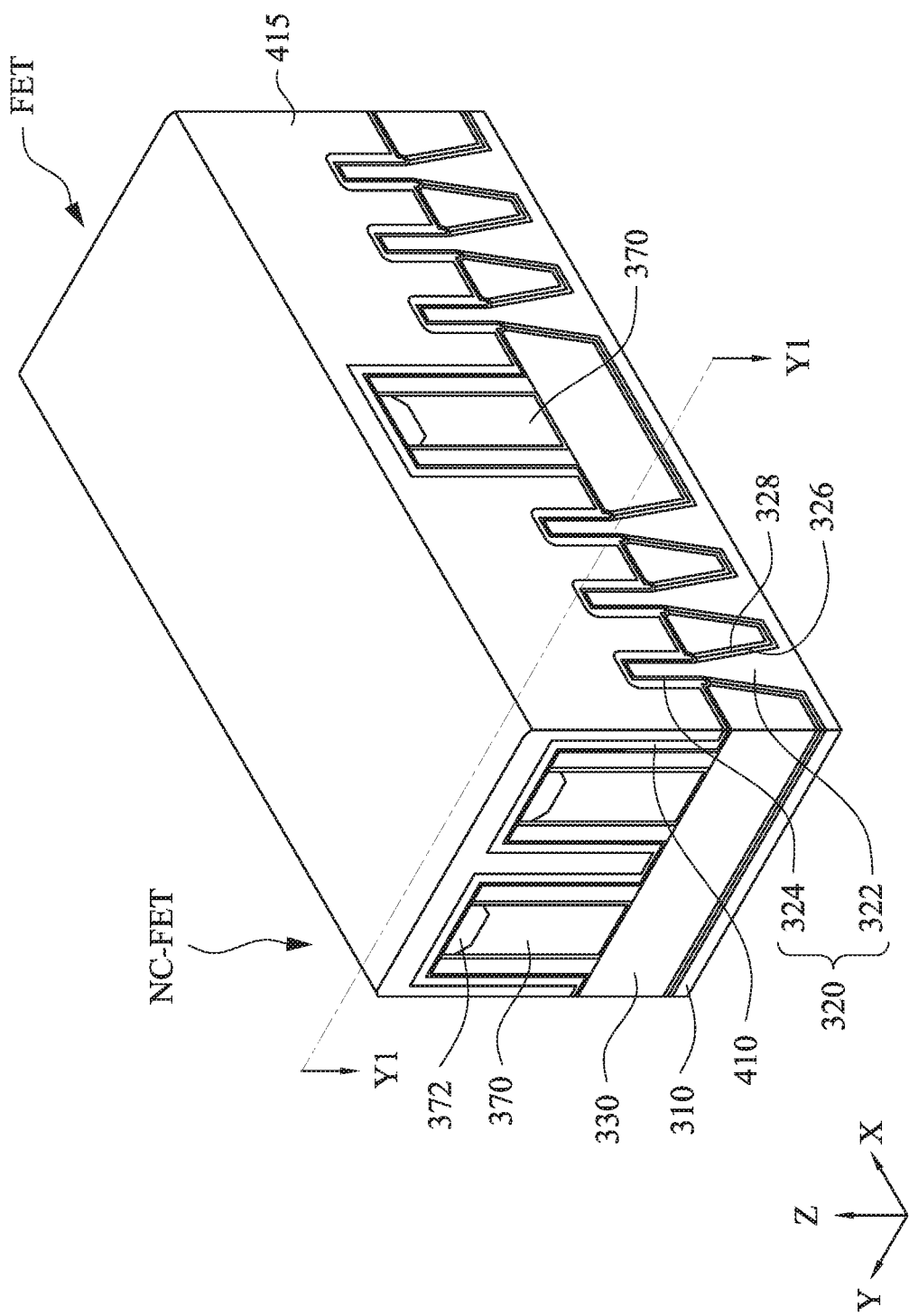
FIGS. 22A and 22B show one of various stages of manufacturing operations for an NCFET and a FET in accordance with another embodiment of the present disclosure.
Figure 22B:
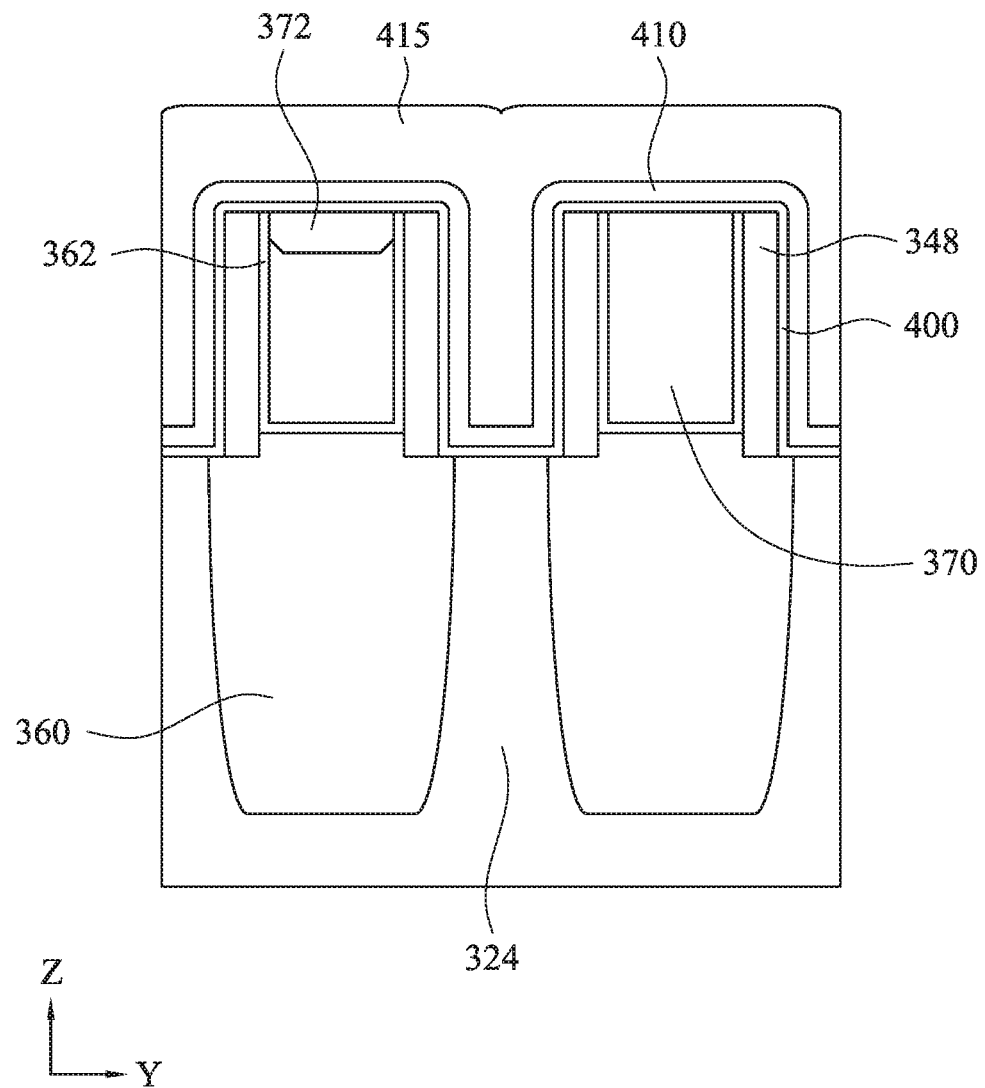

Then, a first conductive layer 415 for a first gate electrode (internal gate) for the NC-FET and a metal gate electrode for the regular FET is formed over the WFM layer 410, as shown in FIGS. 22A and 22B. FIG. 22B is the cross sectional view corresponding to line Y1-Y1 of FIG. 22A. The first conductive layer 415 fills the gate space 390, and may be formed over the insulating structure.

The conductive material for the first conductive layer 415 includes one or more materials selected from a group of W, Cu, Ti, Ag, Al, TiAl, TiAlN, TaC, TaCN, TaSiN, Mn, Co, Pd, Ni, Re, Ir, Ru, Pt, Zr, TiN, WN, TaN, Ru, alloys such as Ti—Al, Ru—Ta, Ru—Zr, Pt—Ti, Co—Ni, $WN_x$, $TiN_x$, $MoN_x$, $TaN_x$, and $TaSi_xN_y$. In one embodiment, W is used as the first conductive layer 415. In some embodiments, the first conductive layer 415 may be formed using a suitable process such as ALD, CVD, PVD, plating, or combinations thereof.

Figure 23:
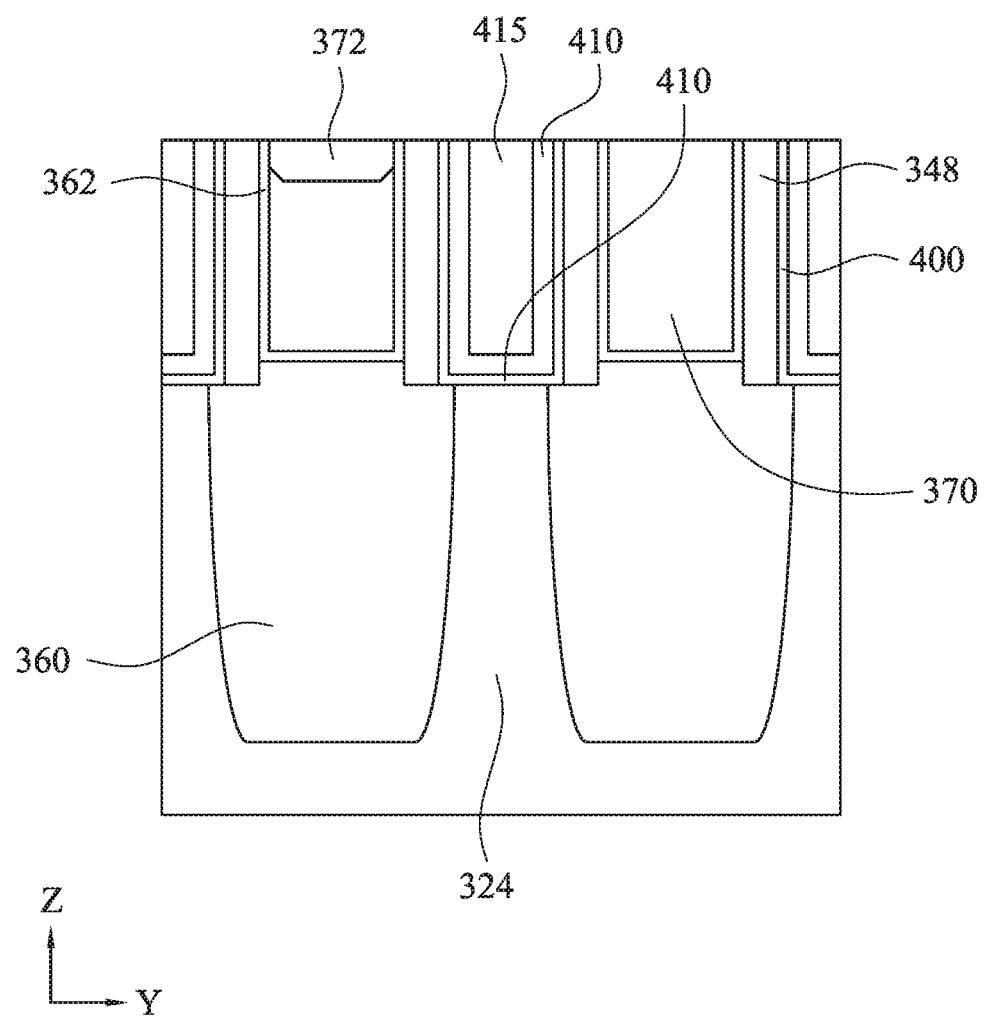
FIG. 23 shows one of various stages of manufacturing operations for an NCFET and a FET in accordance with another embodiment of the present disclosure.

Subsequently, a planarization process, such as a CMP, is performed to remove excess materials, as shown in FIG. 23. By this operation, a metal gate structure for the regular FET is formed (except for a gate cap insulating layer).

Figure 24A:
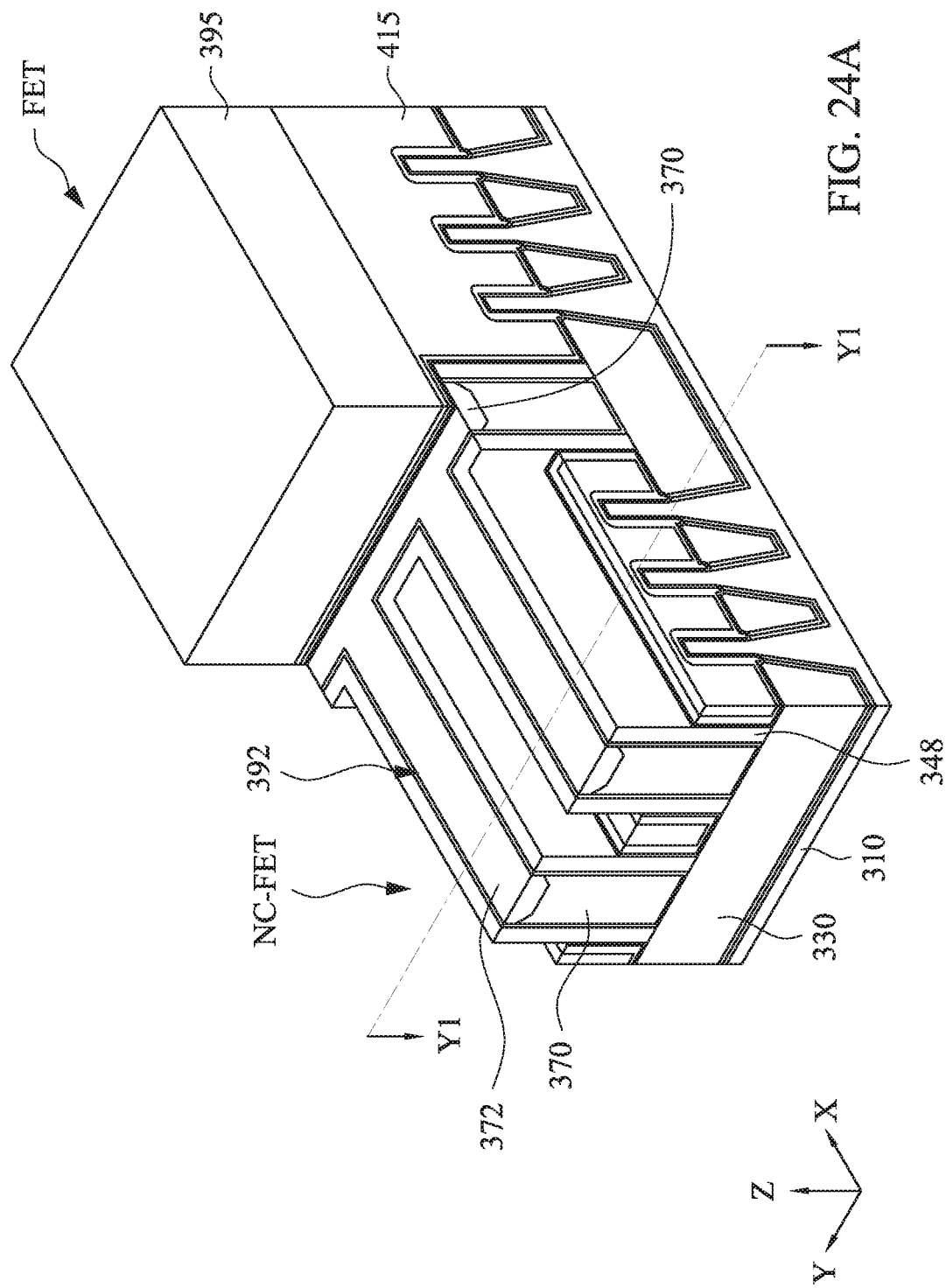
FIGS. 24A and 24B show one of various stages of manufacturing operations for an NCFET and a FET in accordance with another embodiment of the present disclosure.
Figure 24B:
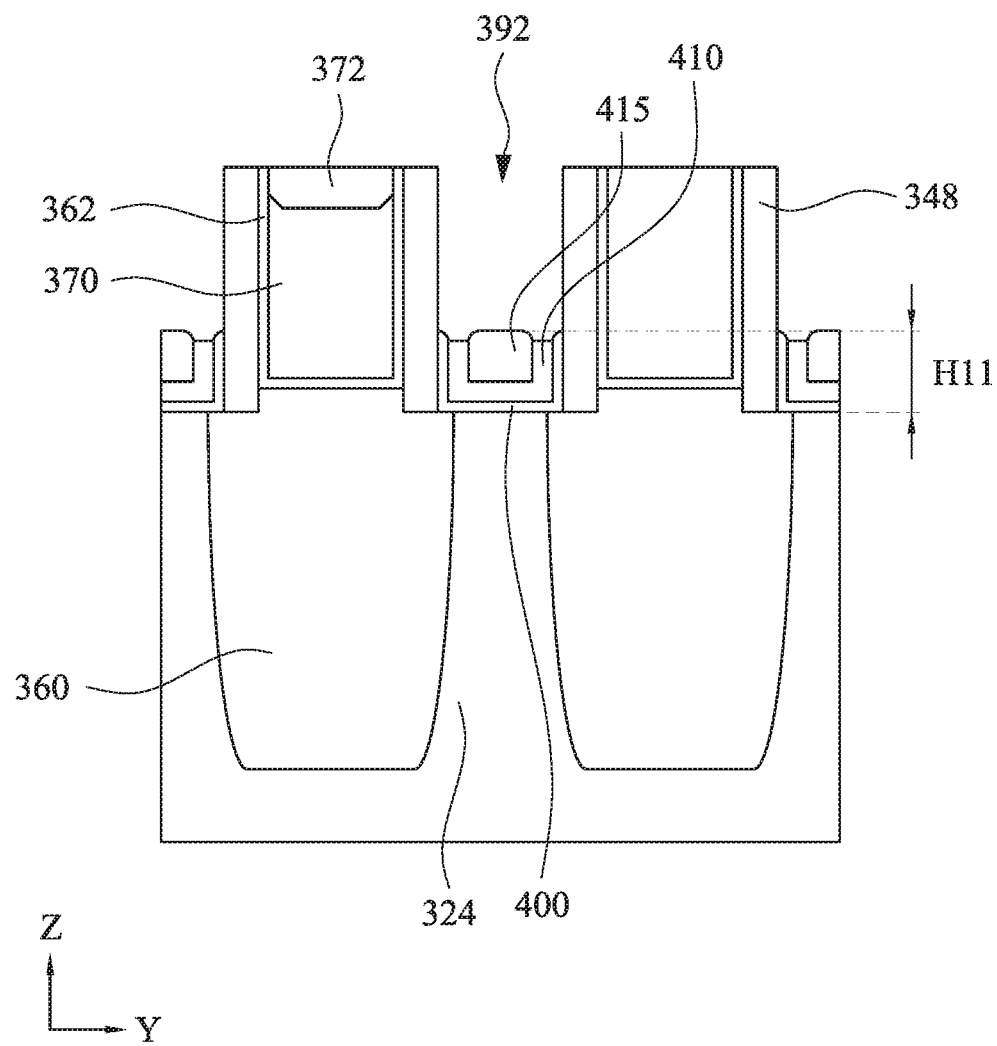

Then, the structures for the regular FETs are covered by a mask layer 395 as shown in FIG. 24A, and the first conductive layer 415, the WFM layer 410 and the gate dielectric layer 400 for the NC-FETs are recessed by using an etching operation, thereby forming a recessed gate space 392 as shown in FIGS. 24A and 24B. FIG. 24B is the cross sectional view corresponding to line Y-Y1 of FIG. 24A. The mask layer 395 may be a photo resist pattern or a hard mask pattern.

In some embodiments, the height H11 of the remaining first conductive layer 415 from the channel 324 is in a range from about 5 nm to about 50 nm in some embodiments. In certain embodiments, due to different etching rates, the WFM layer 410 is etched more than the first conductive layer 415, and the remaining first conductive layer 415 protrudes from the WFM layer 410. In certain embodiments, the gate dielectric layer 400 is not etched. After the recess etching, the mask layer 395 is removed.

Figure 25A:
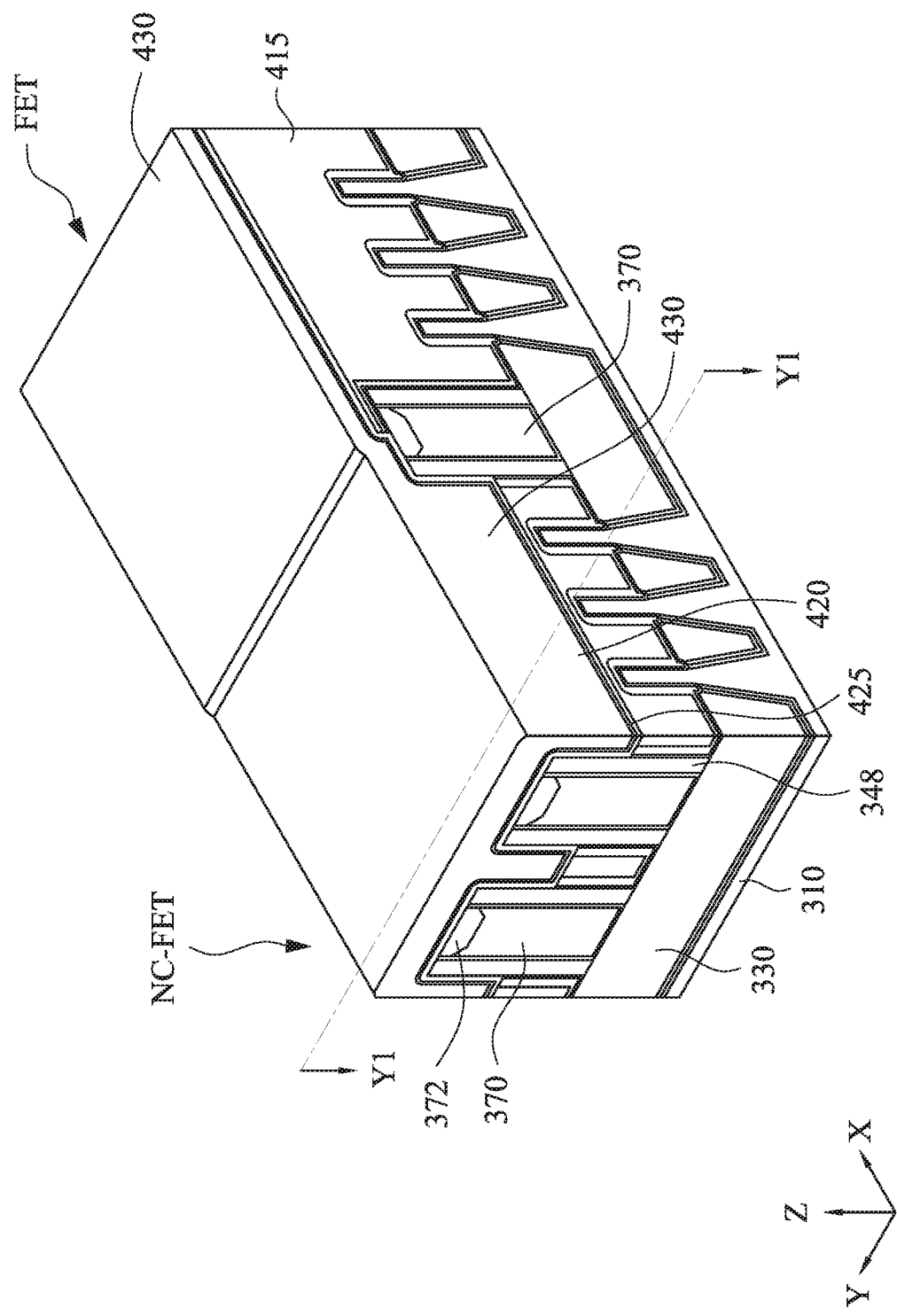
FIGS. 25A and 25B show one of various stages of manufacturing operations for an NCFET and a FET in accordance with another embodiment of the present disclosure.
Figure 25B:
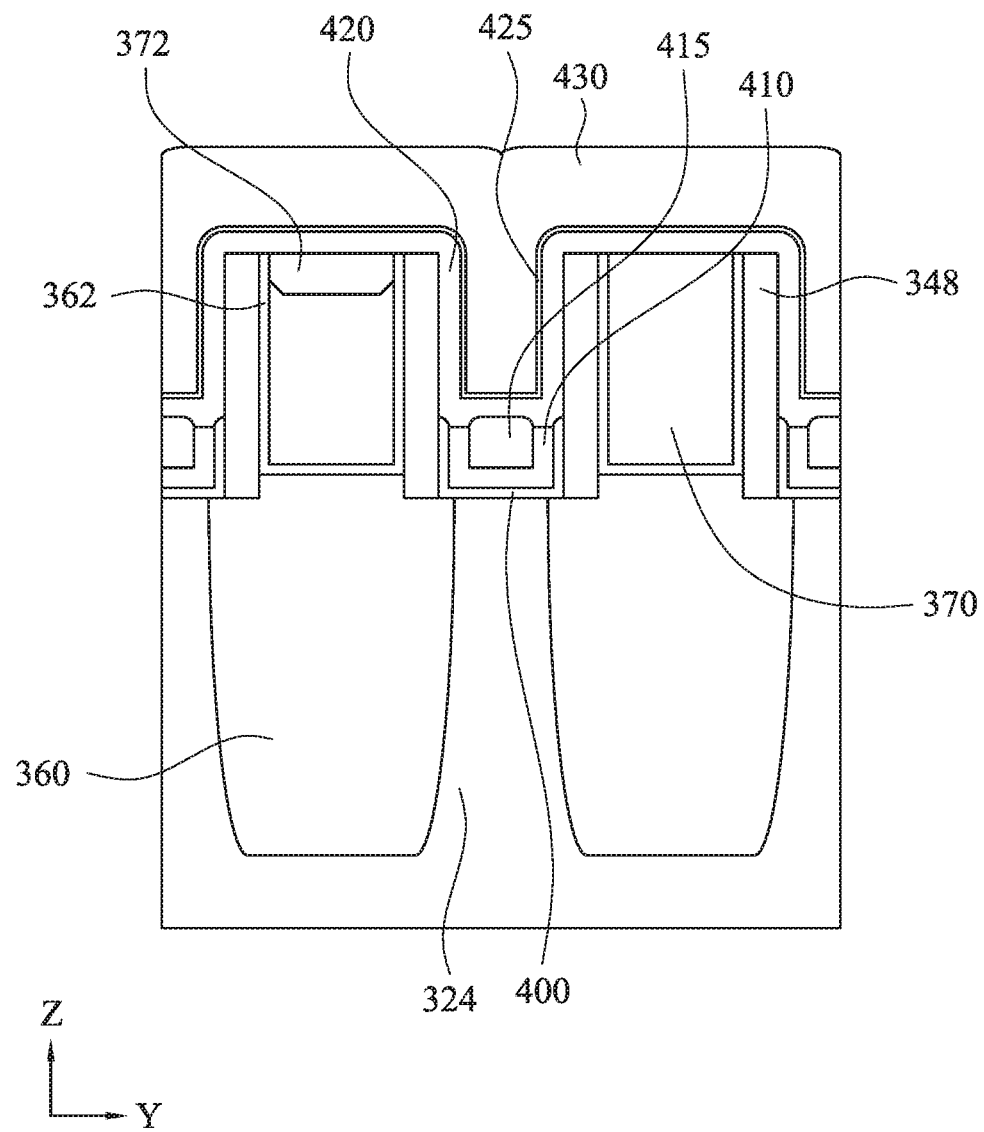

Then, the ferroelectric layer 420, a conductive liner layer 425 and a second conductive layer 430 are sequentially formed in the recessed gate space 392, as shown in FIGS. 25A and 25B. FIG. 25B is the cross sectional view corresponding the line Y-Y1 of FIG. 25A.

The ferroelectric layer 420 can be formed by one of the aforementioned methods. The thickness of the ferroelectric layer 420 is in a range from about 1 nm to about 20 nm in some embodiments. As shown in FIG. 25B, the ferroelectric layer 420 is conformally formed in some embodiments.

The conductive liner layer 425 is a cap or an adhesive layer for the second conductive layer, and is made of, for example, Ti, Ta, TiN and/or TaN. The thickness of the conductive liner layer 425 is in a range from about 0.5 nm to about 10 nm in some embodiments, and may be formed by a suitable process such as ALD, CVD, PVD, plating, or combinations thereof. As shown in FIG. 25B, the conductive liner layer 425 is conformally formed in some embodiments.

The second conductive layer 430 is made of the same as or similar material to the first conductive layer 415, and may be formed using a suitable process such as ALD, CVD, PVD, plating, or combinations thereof. In one embodiment, W is used as the second conductive layer 430.

After the second conductive layer 430, an annealing operation is performed, thereby transforming the phase of the ferroelectric layer from a polycrystalline structure to a crystalline structure, for example, an orthorhombic structure which exhibits ferroelectricity. The annealing operation includes rapid thermal annealing (RTA) performed at a temperature between about 400° C. to about 900° C., in some embodiments.

Figure 26A:
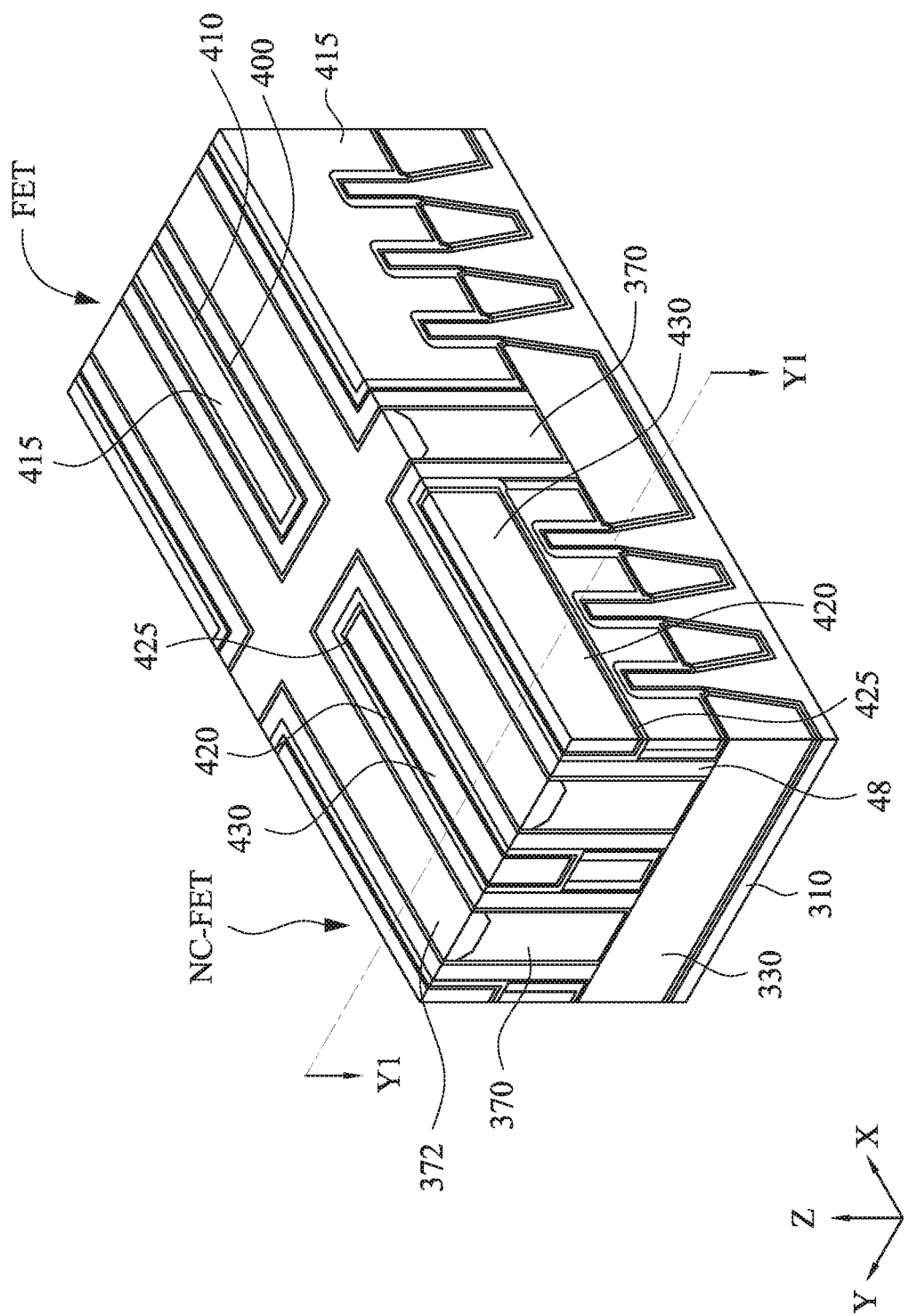
FIGS. 26A and 26B show one of various stages of manufacturing operations for an NCFET and a FET in accordance with another embodiment of the present disclosure.
Figure 26B:
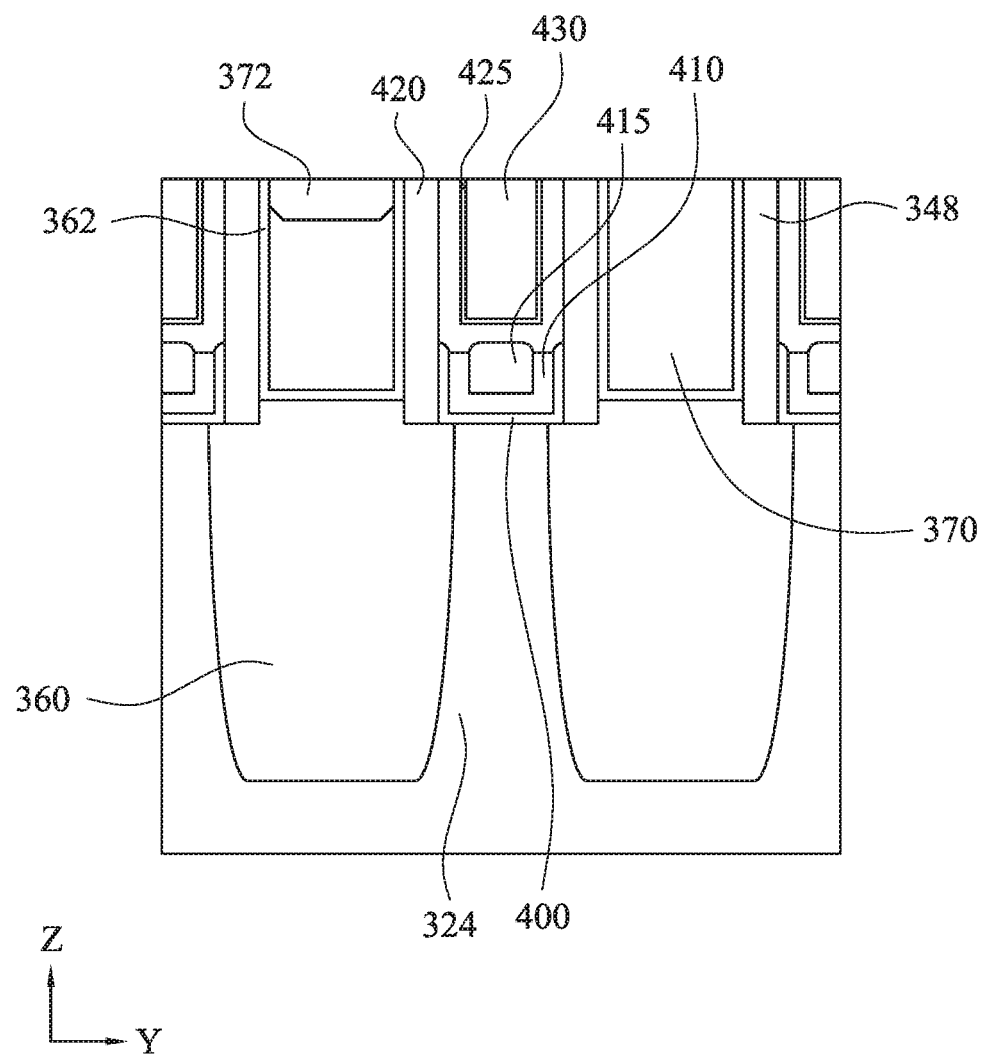

Subsequently, a planarization process, such as a CMP, is performed to remove excess materials, as shown in FIGS. 26A and 26B. FIG. 26B is the cross sectional view corresponding the line Y-Y1 of FIG. 26A. By this operation, upper portions of the sidewall spacers 348, the ESL layer 362 and the dielectric layer 372 are exposed. The ferroelectric layer 420 and the conductive liner layer 425 formed in the regular FET region are removed by the planarization operation.

Figure 27A:
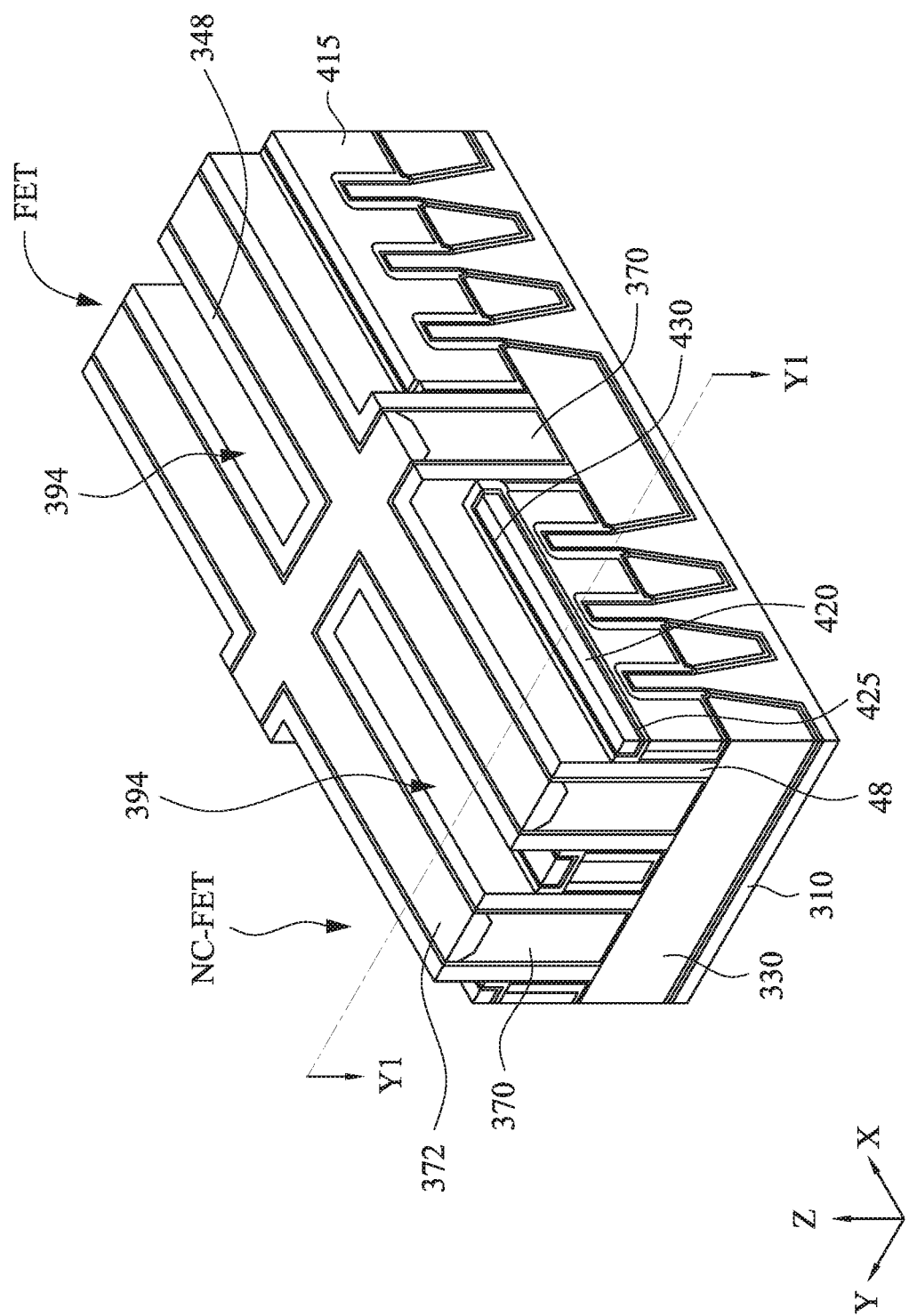
FIGS. 27A and 27B show one of various stages of manufacturing operations for an NCFET and a FET in accordance with another embodiment of the present disclosure.
Figure 27B:
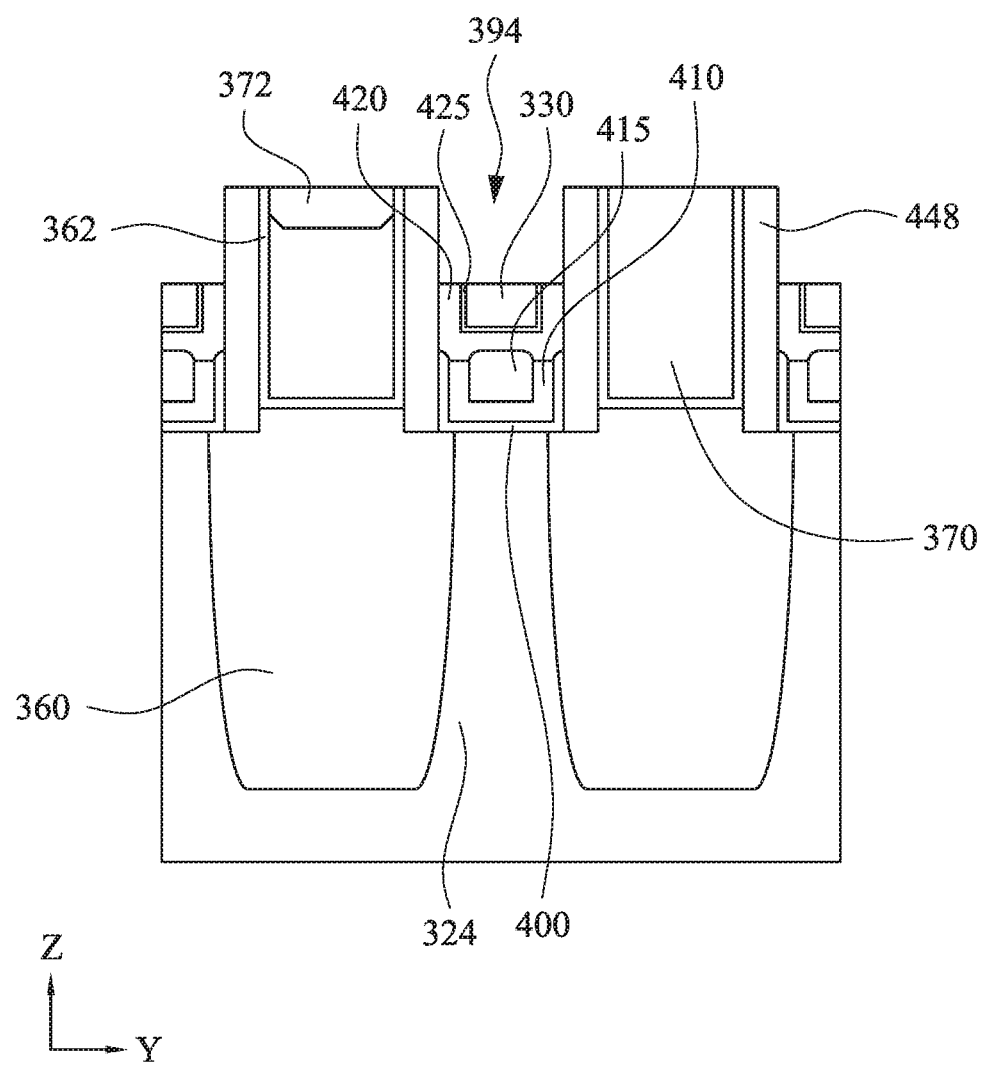

Then, a recess etching operation is performed, thereby reducing the height of the gate structure for the NC-FinFET and the height of the gate structure for the regular FET and forming a second recessed gate space 394, as shown in FIGS. 27A and 27B.

Figure 28A:
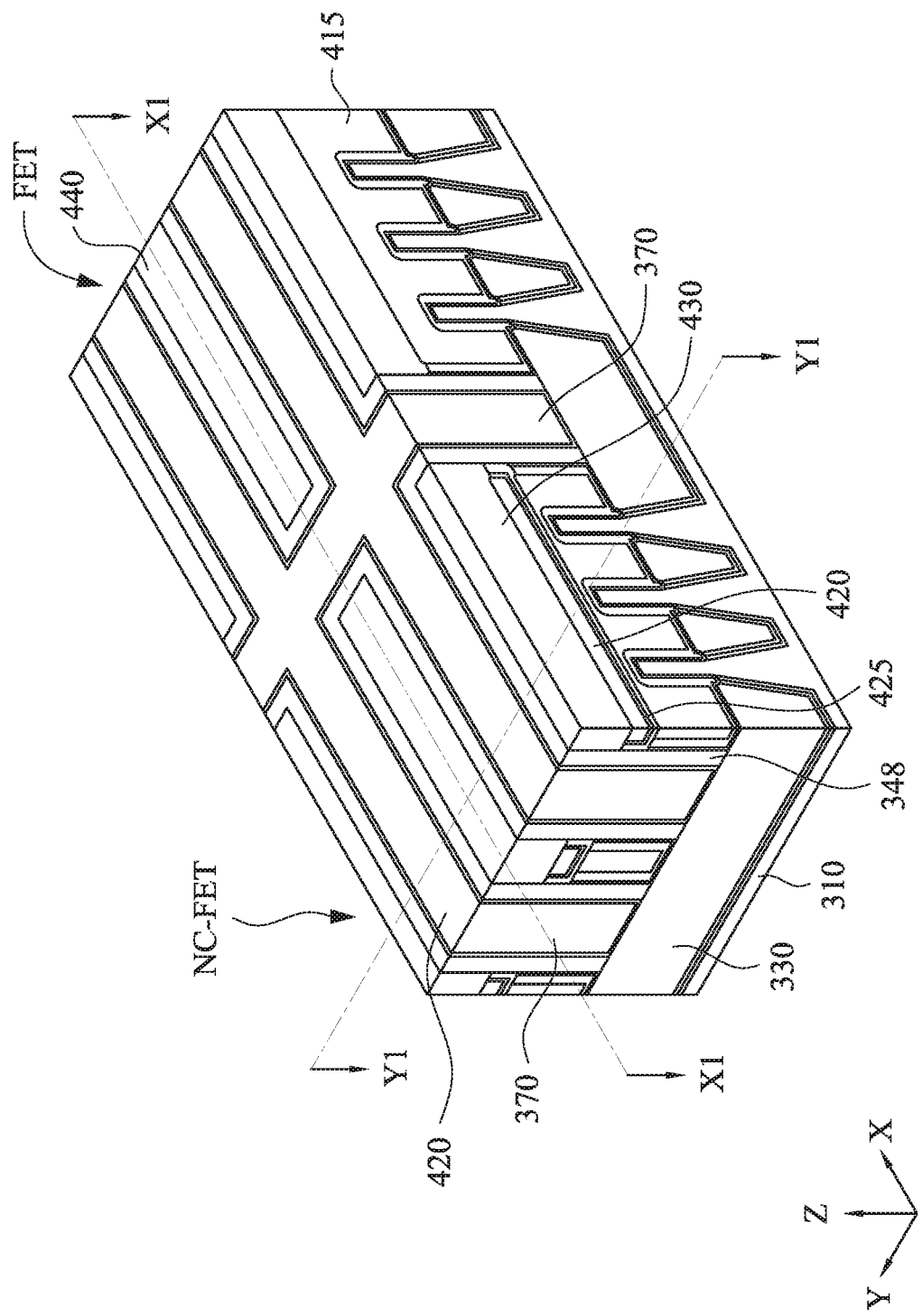
FIGS. 28A and 28B show one of various stages of manufacturing operations for an NCFET and a FET in accordance with another embodiment of the present disclosure.
Figure 28B:
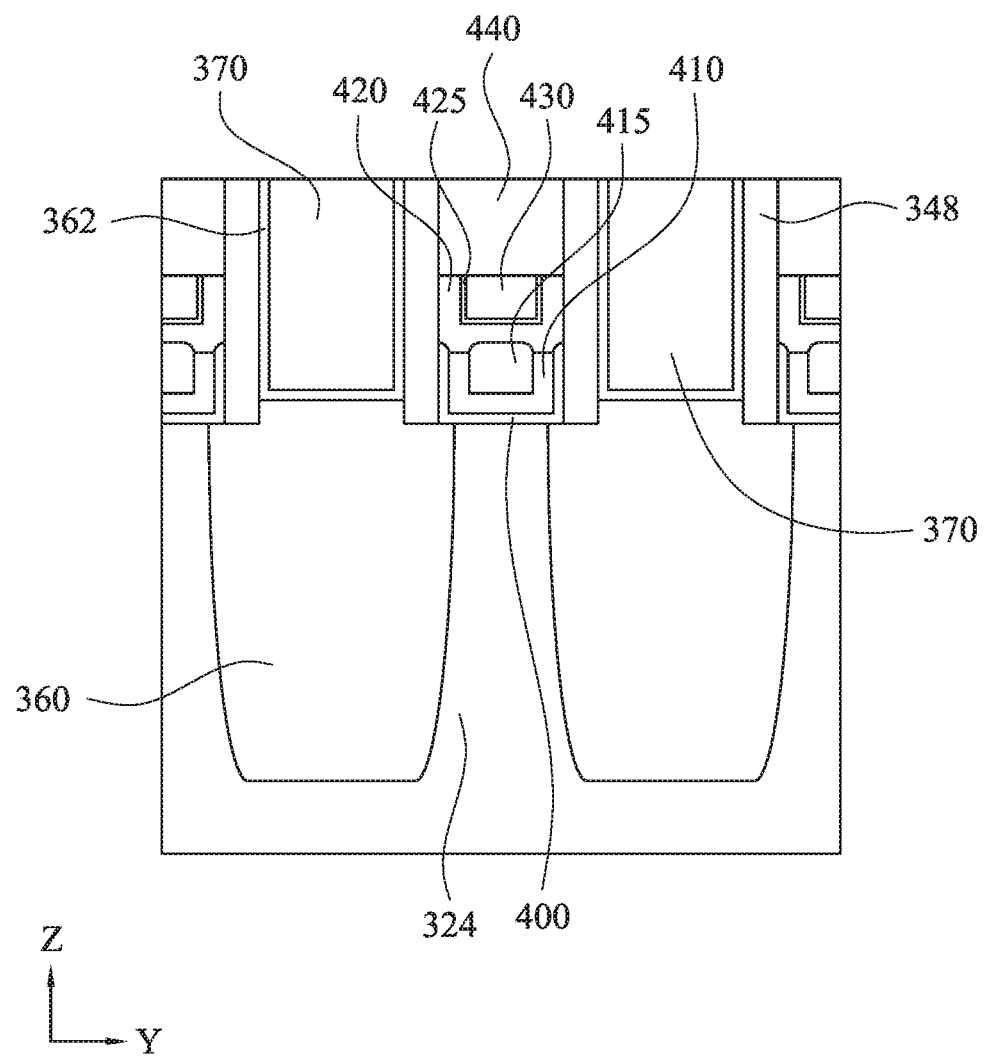

Further, as shown in FIGS. 28A and 28B, after the recess etching operation, a gate cap layer 440 is formed in the second recessed gate space 394 to protect the gate electrodes during subsequent processes. In some embodiments, the gate cap layer 440 includes $SiO_2$, SiCN, SiON, SiN, $Al_2O_3$, $La_2O_3$, SiN, a combination thereof, or the like, but other suitable dielectric films may be used. The gate cap layer 440 may be formed using, for example, CVD, PVD, spin-on-glass, or the like. Other suitable process steps may be used. A planarization process, such as a CMP, may be performed to remove excess materials. During the planarization process, the dielectric layer 372 is also removed, as shown in FIGS. 28A and 28B, in some embodiments. The thickness of the gate cap layer 440 after the planarization process is in a range from about 5 nm to about 50 nm in some embodiments.

Figure 29A:
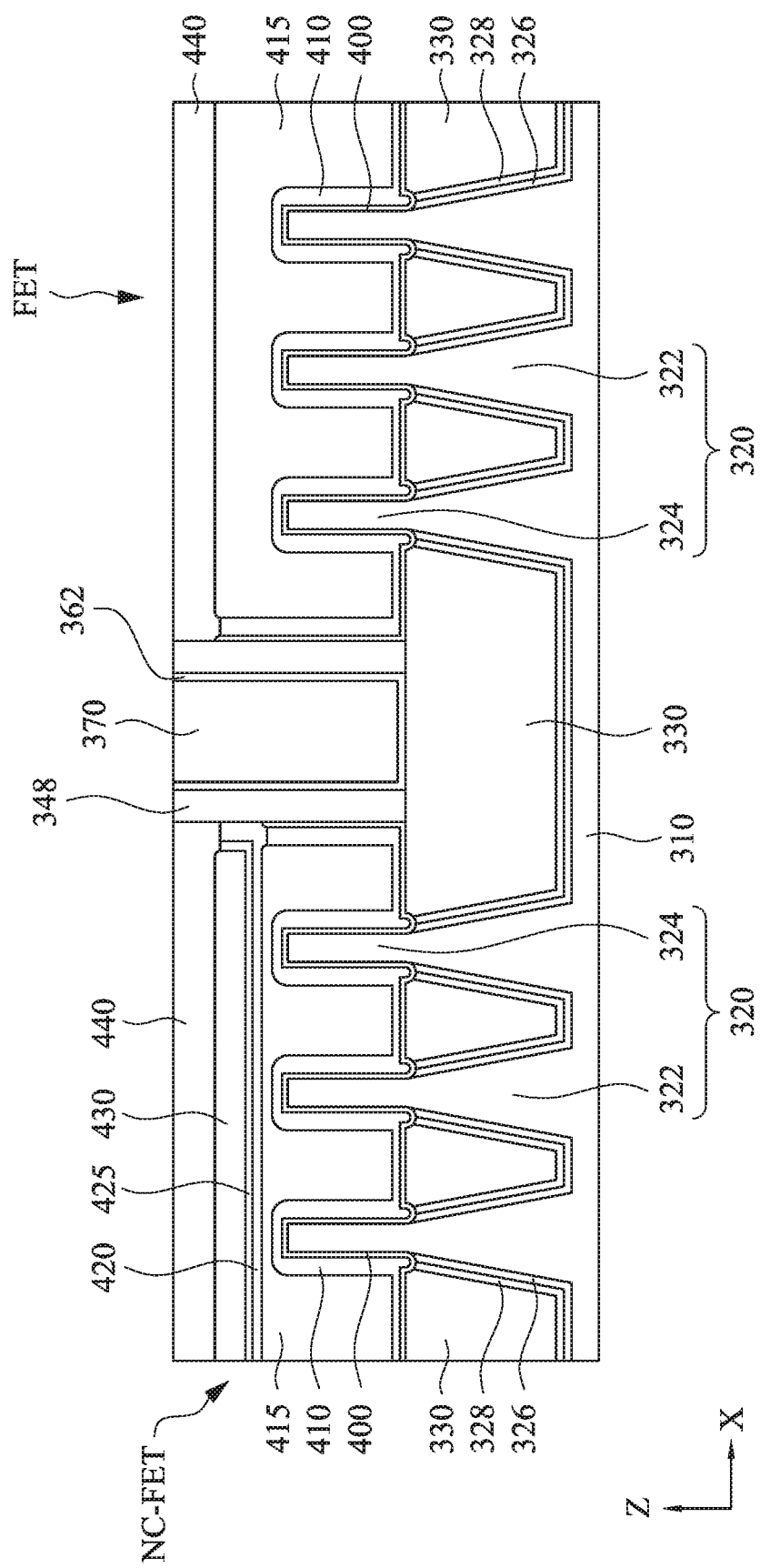
FIGS. 29A, 29B and 29C show one of various stages of manufacturing operations for an NCFET and a FET in accordance with another embodiment of the present disclosure.
Figure 29B:
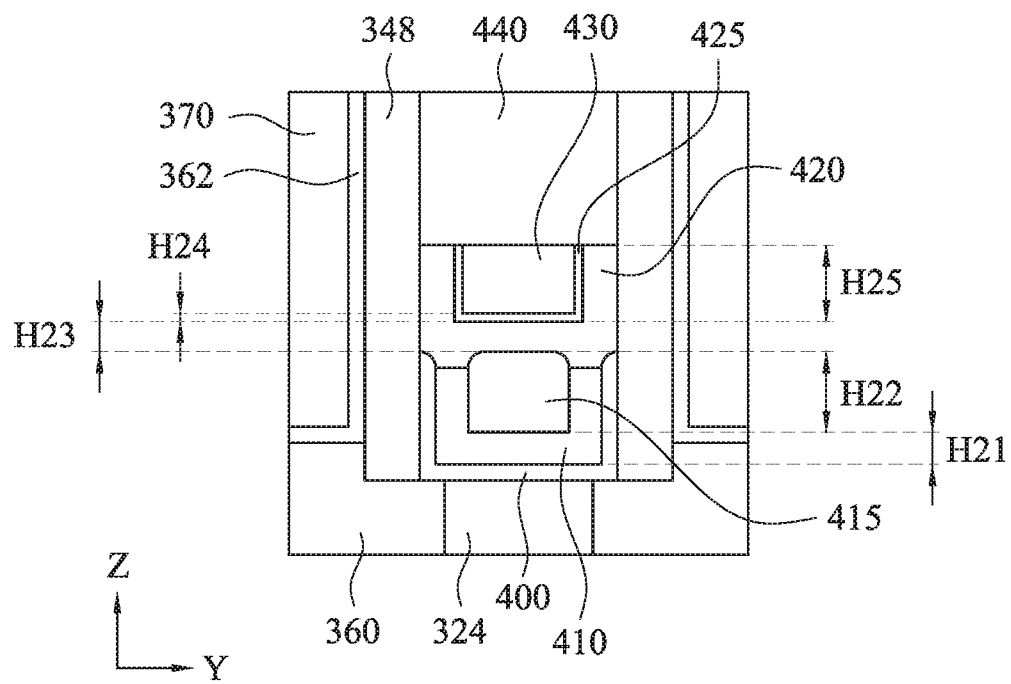
Figure 29C:
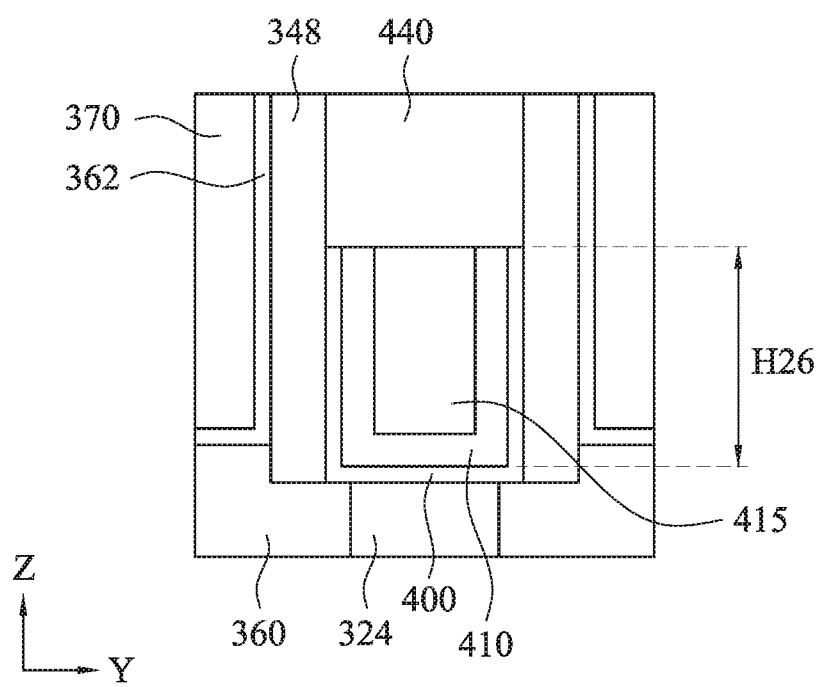

FIG. 29A shows an exemplary cross sectional view of a semiconductor device along the X direction according to some embodiments of the present disclosure. FIG. 29B shows an exemplary cross sectional view of the NC-FinFET portion along the Y direction, and FIG. 29C shows an exemplary cross sectional view of the regular FinFET portion along the Y direction according to some embodiments of the present disclosure.

As shown in FIG. 29A, the NC-FinFET portion includes an MIM structure formed by the second conductive layer 430, the conductive liner layer 425, the ferroelectric layer 420 and the first conductive layer 415, together with a MOS structure formed by the first conductive layer 415, the WFM layer 410, the gate dielectric layer 400 and the channel 324, while the regular FinFET portion includes the MOS structure only.

In the NC-FinFET portion, the upper surface of the MIM structure is substantially flat, as shown in FIG. 29B. In other words, a bottom of the gate cap insulating layer 440 is substantially flat, which means that the variation is less than 1.0 nm.

The thickness H21 of the WFM layer 410 above the channel (upper portion of the fin structure) 324 varies depending on the types of the NC-FET (conductivity type and/or operational voltage), and is in a range from about 0.5 nm to about 20 nm in some embodiments. The thickness H22 of the first conductive layer 415 above the channel 324 is in a range from about 5 nm to about 50 nm in some embodiments. The thickness H23 of the ferroelectric layer 420 above the first conductive layer (internal gate) 415 is in a range from about 2 nm to about 20 nm in some embodiments. The thickness H24 of the conductive liner layer 425 above the first conductive layer (internal gate) 415 is in a range from about 0.5 nm to about 10 nm in some embodiments. The thickness H25 of the second conductive layer 430 above the channel 324 is in a range from about 5 nm to about 50 nm in some embodiments. In certain embodiments, H22 is equal to or greater than H25, and in other embodiments, H22 is smaller than H25.

In the regular FinFET portion, the height H26 of the metal gate (the first conductive layer 415 and the WFM layer 410) above the channel (upper portion of the fin structure) 324 is in a range from about 10 nm to about 110 nm in some embodiments.

As shown in FIGS. 29B and 29C, the gate dielectric layer 400 and the WFM layer 410 have a "U-shape" in the Y directional cross section having a thin center portion and thick side portions, and as shown in FIG. 29A, the gate dielectric layer 400 and the WFM layer 410 have a "U-shape" between adjacent channels 324 and/or between the sidewall spacer 348 and the channel 324, in the X directional cross section.

Further, as shown in FIG. 29B, the ferroelectric layer 420, the conductive liner layer 425 and the second conductive layer 430 have a "U-shape" in the Y directional cross section, as shown in FIG. 29A, the ferroelectric layer 420, the conductive liner layer 425 and the second conductive layer 430 have a "U-shape" between the sidewall spacers 348, in the X directional cross section, although FIG. 29A shows only one end portion of the U-shape.

After forming the gate cap layer 440 to be in direct contact with the second conductive layer 430 for the NC-FET and with the first conductive layer 415 for the regular FET, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, because the ferroelectric layer includes a crystalline phase in an amorphous matrix, it is possible to maximize strain effects and to stabilize a ferroelectric property. Further, it is possible to improve operational properties of NCFETs.

In accordance with an aspect of the present disclosure, in a method of manufacturing a negative capacitance structure, a ferroelectric dielectric layer is formed over a first conductive layer disposed over a substrate. A second conductive layer is formed over the dielectric layer. The ferroelectric dielectric layer includes an amorphous layer and crystals. In one or more of the foregoing and following embodiments, the amorphous layer and the crystals are made of a same material including $HfO_2$ and an oxide of a metal element, where the metal element is one or more selected from the group consisting of Zr, Al, La, Y, Gd and Sr. In one or more of the foregoing and following embodiments, the ferroelectric dielectric layer is formed by an atomic layer deposition (ALD) method at a substrate temperature in a range from 100° C. to 300° C. In one or more of the foregoing and following embodiments, after the ferroelectric dielectric layer is formed by ALD method, an annealing operation is performed. In one or more of the foregoing and following embodiments, the crystals are nanocrystals dispersed in the amorphous layer. In one or more of the foregoing and following embodiments, an average size of the nanocrystals is in a range from 0.5 nm to 5 nm. In one or more of the foregoing and following embodiments, the crystals have a columnar shape extending along a film stack direction and embedded in the amorphous layer. In one or more of the foregoing and following embodiments, an average diameter of the columnar shape is in a range from 0.5 nm to 5 nm. In one or more of the foregoing and following embodiments, an average length of the columnar shape is in a range from 1 nm to 5 nm. In one or more of the foregoing and following embodiments, the crystals having a columnar shape are located closer to the first conductive layer such that a density of the crystals in the ferroelectric layer is larger in a region closer to the first conductive layer than in a region closer to the second conductive layer. In one or more of the foregoing and following embodiments, the ferroelectric dielectric layer is formed by the following method. The crystals having a columnar shape are formed over the first conductive layer, and the amorphous layer is formed over the crystals having a columnar shape. In one or more of the foregoing and following embodiments, the crystals having a columnar shape are located closer to the second conductive layer such that a density of the crystals in the ferroelectric layer is larger in a region closer to the second conductive layer than in a region closer to the first conductive layer. In one or more of the foregoing and following embodiments, the ferroelectric dielectric layer is formed by the following method. A first amorphous layer is formed over the first conductive layer. The crystals having a columnar shape are formed over a first amorphous layer. A second amorphous layer is formed after the crystals having a columnar shape are formed.

In accordance with another aspect of the present disclosure, in a method of manufacturing a negative capacitance structure, a ferroelectric dielectric layer is formed over a first conductive layer disposed over a substrate. A second conductive layer is formed over the ferroelectric dielectric layer. The ferroelectric dielectric layer is formed by the following method. An amorphous oxide layer is formed over the first conductive layer. A metal layer is formed over the amorphous oxide layer. The substrate is annealed so that metal elements of the metal layer diffuse into the amorphous layer. In one or more of the foregoing and following embodiments, the amorphous layer and the amorphous oxide layer includes $HfO_2$ and the metal element includes one or more selected from the group consisting of Zr, Al, La, Y, Gd and Sr. In one or more of the foregoing and following embodiments, the annealing is performed at a substrate temperature in a range from 300 to 600° C.

In accordance with another aspect of the present disclosure, in a method of manufacturing a negative capacitance structure, a ferroelectric dielectric layer is formed over a first conductive layer disposed over a substrate. A second conductive layer is formed over the ferroelectric dielectric layer. The ferroelectric dielectric layer is formed by the following method. An amorphous oxide layer is formed over the first conductive layer. The amorphous oxide layer is an oxygen-deficient oxide. The amorphous oxide layer is annealed in an oxygen-containing atmosphere. In one or more of the foregoing and following embodiments, the amorphous oxide layer includes $HfO_{2-x}$, where $0<x\leq0.8$, and further contains one or more selected from the group consisting of Zr, Al, La, Y, Gd and Sr. In one or more of the foregoing and following embodiments, the annealing is performed at a substrate temperature in a range from 400 to 800° C. In one or more of the foregoing and following embodiments, the first conductive layer includes SiGe.

In accordance with another aspect of the present disclosure, in a method of manufacturing a negative capacitance field effect transistor (NC-FET), a ferroelectric dielectric layer is formed over the ferroelectric dielectric layer, and a gate electrode layer is formed over the ferroelectric dielectric layer. The ferroelectric dielectric layer includes an amorphous layer and crystals.

In accordance with one aspect of the present disclosure, a negative capacitance structure includes a first conductive layer, a ferroelectric dielectric layer disposed over the first conductive layer, and a second conductive layer disposed over the ferroelectric dielectric layer. The ferroelectric dielectric layer includes an amorphous layer and crystals. In one or more of the foregoing and following embodiments, the amorphous layer and the crystals are made of a same material including $HfO_2$ and an oxide of a metal element, where the metal element is one or more selected from the group consisting of Zr, Al, La, Y, Gd and Sr. In one or more of the foregoing and following embodiments, the crystals are nanocrystals dispersed in the amorphous layer. In one or more of the foregoing and following embodiments, an average size of the nanocrystals is in a range from 0.5 nm to 5 nm. In one or more of the foregoing and following embodiments, the crystals have a columnar shape extending along a film stack direction and embedded in the amorphous layer. In one or more of the foregoing and following embodiments, an average diameter of the columnar shape is in a range from 0.5 nm to 5 nm. In one or more of the foregoing and following embodiments, an average length of the columnar shape is in a range from 1 nm to 5 nm. In one or more of the foregoing and following embodiments, the crystals having a columnar shape are located closer to the first conductive layer such that a density of the crystals in the ferroelectric layer is larger in a region closer to the first conductive layer than in a region closer to the second conductive layer. In one or more of the foregoing and following embodiments, the crystals having a columnar shape are located closer to the second conductive layer such that a density of the crystals in the ferroelectric layer is larger in a region closer to the second conductive layer than in a region closer to the first conductive layer. In one or more of the foregoing and following embodiments, the amorphous layer and the crystals are made of $HfZrO_2$.

In accordance with another aspect of the present disclosure, a negative capacitance field effect transistor (NC-FET) includes a channel layer made of a semiconductor, a ferroelectric dielectric layer disposed over the channel layer, and a gate electrode layer disposed over the ferroelectric dielectric layer. The ferroelectric dielectric layer includes an amorphous layer and crystals. In one or more of the foregoing and following embodiments, the amorphous layer and the crystals are made of a same material including $HfO_2$ and an oxide of a metal element, where the metal element is one or more selected from the group consisting of Zr, Al, La, Y, Gd and Sr. In one or more of the foregoing and following embodiments, the crystals are nanocrystals dispersed in the amorphous layer. In one or more of the foregoing and following embodiments, the crystals have a columnar shape extending along a film stack direction and embedded in the amorphous layer. In one or more of the foregoing and following embodiments, the crystals having a columnar shape are located closer to the channel layer such that a density of the crystals in the ferroelectric layer is larger in a region closer to the channel layer than in a region closer to the gate electrode layer. In one or more of the foregoing and following embodiments, the crystals having a columnar shape are located closer to the gate electrode layer such that a density of the crystals in the ferroelectric layer is larger in a region closer to the gate electrode layer than in a region closer to the channel layer. In one or more of the foregoing and following embodiments, the channel layer includes SiGe. In one or more of the foregoing and following embodiments, the gate electrode layer includes a first conductive layer disposed on the ferroelectric dielectric layer, and the first conductive layer is made of TiN or TiN doped with one or more elements. In one or more of the foregoing and following embodiments, the gate electrode layer further includes a second conductive layer disposed on the first conductive layer, and the second conductive layer is made of TaN.

In accordance with another aspect of the present disclosure, a negative capacitance field effect transistor (NC-FET) includes a channel layer made of a semiconductor, a first dielectric layer disposed over the channel layer, a first conductive layer disposed over the first dielectric layer, a second dielectric layer disposed over the first conductive layer, and a gate electrode layer disposed over the second dielectric layer. The second dielectric layer includes a compressive strained oxide of hafnium and a metal element X, where X is one or more selected from the group consisting of Zr, Al, La, Y, Gd and Sr.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A negative capacitance structure, comprising:
   a first conductive layer;
   a ferroelectric dielectric layer disposed over the first conductive layer; and
   a second conductive layer disposed over the ferroelectric dielectric layer, wherein:
   the ferroelectric dielectric layer includes an amorphous layer and crystals, and the crystals are nanocrystals dispersed in the amorphous layer, and
   the amorphous layer and the crystals are made of $HfZrO_2$.

2. The negative capacitance structure of claim 1, wherein the first conductive layer is made of a semiconductor material.

3. The negative capacitance structure of claim 1, wherein an average size of the nanocrystals is in a range from 0.5 nm to 5 nm.

4. The negative capacitance structure of claim 2, wherein the second conductive layer includes, closer to the ferroelectric dielectric layer, a TaN layer, a TiN or TiAl layer, a Ti layer and a W layer.

5. A negative capacitance field effect transistor (NC-FET), comprising:
   a channel layer made of a semiconductor;
   a gate dielectric layer disposed over the channel layer;
   a first gate electrode layer disposed over the gate dielectric layer;
   a ferroelectric dielectric layer disposed over the first gate electrode layer; and a second gate electrode layer disposed over the ferroelectric dielectric layer, wherein the ferroelectric dielectric layer includes an amorphous layer and crystals, and the crystals are nanocrystals dispersed in the amorphous layer, and the amorphous layer and the crystals are made of $HfZrO_2$.

6. The NC-FET of claim 5, wherein the second gate electrode layer includes a TaN layer, a TiN or TiAl layer, a Ti layer and a W layer.

7. The NC-FET of claim 5, wherein the channel layer includes SiGe.

8. The NC-FET of claim 5, wherein:

the second gate electrode layer includes a first conductive layer disposed on the ferroelectric dielectric layer, and the first conductive layer is made of TiN or TiN doped with one or more elements.

9. The NC-FET of claim 8, wherein:

the second gate electrode layer further includes a second conductive layer disposed on the first conductive layer, and the second conductive layer is made of TaN.

10. A gate structure of a negative capacitance field effect transistor (NC-FET), comprising:

a channel layer made of a semiconductor;

a first dielectric layer disposed over the channel layer;

a first conductive layer disposed over the first dielectric layer;

a second dielectric layer disposed over the first conductive layer; and a gate electrode layer disposed over the second dielectric layer, wherein the second dielectric layer includes a compressive strained oxide, and the second dielectric layer includes an amorphous layer and crystals, which are made of a same material selected from the group consisting of $La_2O_3$, $Y_2O_3$ and $Gd_2O_3$.

11. The negative capacitance structure of claim 2, wherein the metal element is one or more selected from the group consisting of Y and Gd.

12. The negative capacitance structure of claim 1, wherein the nanocrystals have an orthorhombic structure.

13. The negative capacitance structure of claim 12, wherein the nanocrystals consists of an orthorhombic crystal phase.

14. The negative capacitance structure of claim 12, wherein the nanocrystals further includes one or more of a monolithic phase, a cubic phase or a tetragonal phase.

15. The NC-FET of claim 5, wherein an average size of the nanocrystals is in a range from 0.5 nm to 5 nm.

16. The NC-FET of claim 5, wherein the channel layer comprise a semiconductor fin protruding from an isolation insulating layer.

17. The NC-FET of claim 5, wherein each of the gate dielectric layer and the ferroelectric dielectric layer has a U-shape cross section.

18. The gate structure of claim 10, wherein the crystals are nanocrystals dispersed in the amorphous layer.

19. The gate structure of claim 18, wherein an average size of the nanocrystals is in a range from 0.5 nm to 5 nm.

20. The gate structure of claim 10, wherein the second dielectric layer has a U-shape cross section.

* * * * *